(12) United States Patent
Burke et al.

(10) Patent No.: US 7,089,766 B2
(45) Date of Patent: Aug. 15, 2006

(54) METHOD OF FORMING OPTICAL FIBER PREFORMS

(76) Inventors: Gerald E. Burke, 8 Meadow La., Painted Post, NY (US) 14870; Steven B. Dawes, 4 E. 4th St., Corning, NY (US) 14830; V. Srikant, 4C2 Candlewyck Apartments, Ithaca, NY (US) 14850; Pushkar Tandon, 4 Briarcliff Dr., Corning, NY (US) 14830

( * ) Notice: Subject to any disclaimer, the term of this patent is extended or adjusted under 35 U.S.C. 154(b) by 0 days.

(21) Appl. No.: 11/034,359

(22) Filed: Jan. 10, 2005

(65) Prior Publication Data
US 2005/0155388 A1    Jul. 21, 2005

Related U.S. Application Data

(62) Division of application No. 09/833,540, filed on Apr. 11, 2001, now abandoned.

(60) Provisional application No. 60/200,405, filed on Apr. 28, 2000, provisional application No. 60/258,132, filed on Dec. 22, 2000.

(51) Int. Cl.
*C03B 37/018*    (2006.01)
*C03B 37/029*    (2006.01)

(52) U.S. Cl. .............................. 65/414; 65/421; 65/422; 65/427

(58) Field of Classification Search .................. 65/397, 65/413, 414, 421, 422, 427
See application file for complete search history.

(56) References Cited

U.S. PATENT DOCUMENTS 3,275,408 A * 9/1966 Winterburn ................. 423/337

(Continued)

FOREIGN PATENT DOCUMENTS

DE    820 963    9/1999

(Continued)

OTHER PUBLICATIONS

Wei, "Precursors for the Production of Fluorine Doped Silica", U.S. Appl. No. 60/187,756 filed on Mar. 8, 2000.

(Continued)

*Primary Examiner*—Carlos Lopez
(74) *Attorney, Agent, or Firm*—Svetlana Z. Short; Randall S. Wayland

(57) ABSTRACT

Methods, apparatus and precursors for producing substantially water-free silica soot, preforms and glass. The methods and apparatus make substantially water-free fused silica preforms or glass by removing water as a reaction product, removing water from the atmosphere, removing water from the transport process, or combinations thereof. In a first embodiment, substantially water-free soot, preforms or glass are achieved by using a hydrogen-free fuel, such as carbon monoxide, in the deposition process. In another embodiment, a soot producing burner has parameters that enable operation on a substantially hydrogen-free fuel. End burners, which minimize water production, are also described. Such water-free methods are useful in depositing fluorine-doped soot because of the low water present and the efficiency in which fluorine is incorporated. In another embodiment, glassy barrier layer methods and apparatus are described for minimizing dopant migration, especially fluorine. Laser and induction methods and apparatus for forming the barrier layer are depicted. A chlorine, fluorine and silica precursor, such as chlorofluorosilane, may be utilized to form fluorinated soot. Other methods and apparatus are directed to combinations of conventional and substantially water-free processes. One embodiment is directed to combustion enhancing additives for addition to the substantially hydrogen-free fuels. The methods and apparatus in accordance with the invention are particularly useful for producing photomask substrates and optical fiber preforms.

18 Claims, 20 Drawing Sheets

U.S. PATENT DOCUMENTS

| | | | | |
|---|---|---|---|---|
| 3,459,522 A | | 8/1969 | Elmer et al. .................... 65/30 |
| 3,791,714 A | | 2/1974 | Mauer .......................... 350/96 |
| 4,235,616 A | * | 11/1980 | Siegfried ..................... 65/418 |
| RE30,883 E | | 3/1982 | Rau et al. .................. 65/60.51 |
| 4,360,371 A | * | 11/1982 | Blankenship et al. ......... 65/403 |
| 4,515,612 A | | 5/1985 | Burrus, Jr. et al. .......... 65/3.12 |
| 4,529,426 A | * | 7/1985 | Pleibel et al. ................. 65/403 |
| 4,583,997 A | | 4/1986 | Staudigl ..................... 55/31 |
| 4,627,866 A | * | 12/1986 | Kanamori et al. ............ 65/397 |
| 4,684,383 A | | 8/1987 | Cavender, Jr. et al. ....... 65/3.12 |
| 5,043,002 A | | 8/1991 | Dobbins et al. ............. 65/3.12 |
| 5,116,400 A | * | 5/1992 | Abbott et al. .................. 65/144 |
| 5,194,714 A | | 3/1993 | Le Sergent ............ 219/121.36 |
| 5,203,898 A | | 4/1993 | Carpenter et al. ........... 65/3.12 |
| 5,236,481 A | * | 8/1993 | Berkey ........................ 65/399 |
| 5,522,007 A | | 5/1996 | Drouart et al. ............. 385/141 |
| 5,609,666 A | * | 3/1997 | Heitmann .................... 65/421 |
| 5,692,087 A | | 11/1997 | Partus et al. ................ 385/123 |
| 5,917,109 A | | 6/1999 | Berkey ........................ 65/412 |
| 5,958,809 A | | 9/1999 | Fujiwara et al. ............. 501/54 |
| 5,970,750 A | | 10/1999 | Humbert et al. ............. 65/391 |
| 6,266,980 B1 | | 7/2001 | Lemon et al. ................ 65/414 |
| 6,530,244 B1 | * | 3/2003 | Oh et al. ....................... 65/417 |
| 6,536,240 B1 | * | 3/2003 | Gouskov et al. ............. 65/391 |
| 6,588,230 B1 | * | 7/2003 | Adler et al. ................. 65/17.3 |
| 6,598,425 B1 | | 7/2003 | Hawtof et al. ............... 65/17.4 |
| 2001/0037662 A1 | | 11/2001 | Kohmura et al. |

FOREIGN PATENT DOCUMENTS

| | | | | |
|---|---|---|---|---|
| DE | 941 971 | | 9/1999 | |
| EP | 1 165 451 | | 9/2003 | |
| GB | 1061042 | | 3/1967 | |
| JP | 57-183331 | * | 11/1982 | ................. 65/414 |
| JP | 57183331 A | * | 11/1982 | |
| JP | 60-65740 | | 4/1985 | |
| JP | 63-123829 | | 5/1988 | |
| JP | 4-74728 | | 3/1992 | |
| JP | 04231336 A | * | 8/1992 | |
| JP | 09-110454 | | 4/1997 | |
| WO | WO 98/18733 | | 5/1998 | |
| WO | WO 98/27018 | | 6/1998 | |
| WO | WO 99/32413 | | 7/1999 | |
| WO | WO 99/67178 | * | 12/1999 | |

OTHER PUBLICATIONS

Patent Abstracts of Japan, T. Koichi, Sep. 21, 1999, Fujikura LTD., JP 11-255533.

G.A. Thomas et al., "Towards the Clarity Limit in Optical Fiber", Nature, vol. 404, Mar. 16, 2000, pp. 262-264.

T.A. Birks et al., "Elimination of Water Peak in Optical Fibre Taper Components", Electronics Letters, vol. 26, No. 21, Oct. 11, 1990, pp. 1761-1762.

* cited by examiner

METHOD OF FORMING OPTICAL FIBER PREFORMS

RELATED APPLICATIONS

This application is a divisional application and claims priority to U.S. application Ser. No. 09/833,540, filed Apr. 11, 2001, now abandoned, which is titled "SUBSTANTIALLY DRY SILICA-CONTAINING SOOT, FUSED SILICA AND OPTICAl. FIBER SOOT PREFORMS, APPARATUS, METHODS AND BURNERS FOR MANUFACTURING THE SAME". This application also claims priority to, and the benefit to U.S. Provisional Patent Application No. 60/200,405 filed Apr. 28, 2000 entitled "Water-Free Fused Silica And Method Therefor," and U.S. Provisional Patent Application 60/258,132 filed Dec. 22, 2000 entitled "substantially Dry, Silica-containing Soot, Fused Silica And Optical Fiber Soot Preforms, Apparatus, Methods And Burners For Manufacturing Same And Method Therefor," the disclosure of which are hereby incorporated by reference herein.

TECHNICAL FIELD

This invention relates to methods and apparatus for producing optical fiber soot preforms, high purity fused silica and silica-containing soot. More specifically, the methods and apparatus relate to producing optical fiber preforms, fused silica and silica-containing soot that is substantially free of water.

BACKGROUND OF THE INVENTION

Photomasks are used in microlithography in printing miniature circuit patterns on silicon wafers and carry an enlarged version of the circuit to be printed thereon. To reduce the size of the circuits on the silicon wafers to get more circuits on the same wafer, light with lower wavelengths are used. For laser light with a low wavelength (less than 248 nm), the photomask substrate can be made with fused silica glass that has high transmitivity. To display high transmitivity, fused silica glass needs to be very pure and contain extremely low levels of water (preferably less than about 10 ppb). The presence of large amounts of water in fused silica product makes the glass not suitable for certain low wavelength applications. Current systems operate at the 248 nm window. Lower wavelength systems heretofore have been largely unsuccessful because of water levels being too high in the silica photomask material. Thus, it would be desirable to produce a glass material that could be used at lower wavelengths.

One process that delivers glass with lower levels of water is the process used to make preforms for optical fiber waveguides (hereinafter the "preform manufacture process"). This preform manufacturing process utilizes several manufacturing steps. First silica containing soot is deposited onto, for example, an alumina bait rod by an Outside Vapor Deposition (OVD) method, for example. The bait rod is removed leaving a tubular soot member with a centerline aperture. This soot member may include the appropriate dopants, for example germania, such that a desired refractive index profile is achieved. The soot preform is then consolidated in a furnace with a vacuum generally applied to close the centerline aperture. Next, the consolidated preform is drawn into core cane; wherein the core cane preferably comprises part or all of the physical core of the optical fiber when finally drawn into fiber. This core cane is cut into lengths and again overclad with silica-containing soot to form the clad portion or another segment of the core if a multi-segment profile is desired. The preform is again consolidated. Chlorine gas, for example, in the atmosphere of the consolidation furnace is used to dry the preform and remove water prior to vitrification into glass in both the above-mentioned consolidation steps. The resulting final consolidated preform, is then placed in a draw furnace and drawn into a fiber in an inert gas atmosphere.

Unfortunately, because of the process currently used to form the soot, water is inevitably formed into the preform. Therefore, it is necessary to employ a drying step before consolidation. Specifically, the water is formed, as will be hereinafter described, because the chemical reaction of the silica precursors and fuels currently used in the process of forming soot form water as a reaction by-product. Moreover, it was discovered by the inventors herein that exposure to atmospheric conditions during standard processing techniques causes the soot preform to pick up further water. In optical telecommunications systems, one factor that determines the distance between amplification stages is the optical fiber attenuation. A significant contributor to poor attenuation is water (OH) present in the preform. Water present causes a peak in the transmission curve at about 1383 nm. This peak has a detrimental effect on the attenuation at 1550 nm, a primary transmission wavelength in optical fiber communications. Thus, it is desirable to reduce the water peak by reducing the water content of the consolidated glass as much as possible.

Furthermore, in fluorine doped optical fibers, fluorine doping at acceptable levels is a considerable problem. Moreover, once fluorine is present in the soot preform, fluorine migration is a significant problem because of fluorine's high mobility and small molecular size. Fluorine is utilized as a refractive index depressant, thus desirably enabling negative indices of refraction where desired. Migration dramatically reduces the amount of fluorine that may be incorporated in the soot. Moreover, migration smoothes out the refractive index profiles desired for optimal signal transmission. Thus, rather than achieving sharp transitions between profile regions, migration causes rounded transitions. Moreover, migration lowers the delta % value (a measure of the refractive index difference relative to the cladding). Thus, since fluorine is extremely mobile, it is very desirable to achieve a method and/or apparatus to prevent migration of such dopants throughout the soot preform during processing.

Equation 3 illustrates the forming high purity fused silica or silica soot in accordance one process used in the prior art. $SiCl_4$ (a silica precursor), oxygen and methane are combined and ignited in a burner to produce glass or soot which is deposited on a substrate surface. In the case of high purity fused silica, the soot is substantially simultaneously consolidated (vitrified) within the furnace when methane is utilized. The by-products of such reactions are carbon dioxide, water vapor and chlorine. In particular, large amounts of water vapor are produced.

$$CH_4 + 3O_2 + SiCl_4 \rightarrow CO_2 + 2H_2O + SiO_2 + 2Cl_2 \qquad \text{(Prior Art 1)}$$

Another currently employed process for manufacture of silica soot uses octamethyl-cyclo-tetra-siloxane (OMCTS) as the raw material for silica soot and natural gas (predominantly methane along with other hydrocarbons) as the fuel. Natural gas is utilized as the fuel to maintain the furnace at high temperatures for manufacture of high purity fused silica. The products of combustion of the natural gas are also water vapor and carbon dioxide. The products of combustion of the OMCTS are silica, water and carbon dioxide as shown in equation 2.

$$C_8H_{24}O_8Si_8+16O_2 \rightarrow 8CO_2+12H_2O+8SiO_2 \quad \text{(Prior Art 2)}$$

Thus, it should be recognized that a significant by-product of the reaction in both processes outlined in equations 1 and 2 is water vapor generated as a result of combustion. Undesirably, this water gets incorporated in soot, and, once present, is very difficult to remove. To attempt to remove the water from soot articles, such as soot preforms, extensive drying step utilizing chlorine are employed. Detrimentally, however, some water remains captured in the consolidated glass produced. The presence of water is detrimental to optical properties of the glass produced. Thus, it is an industry-wide goal to further reduce the water content present in high purity fused silica and also in silica-soot articles such as soot preforms for optical fiber manufacture.

BRIEF SUMMARY OF THE INVENTION

The process and apparatus in accordance with one embodiment of the invention manufactures substantially water-free silica soot, preforms or glass. The process and apparatus to make such water-free fused silica soot, preforms or glass does so by eliminating the possibility of water ever forming in the combustion atmosphere. This is achieved in a first embodiment thereof by utilizing a substantially hydrogen-free fuel, such as carbon monoxide (CO), carbon suboxide ($C_3O_2$), carbonyl sulfide (COS), and the like. Use of such substantially H-free fuels minimizes water formation in the combustion reaction. According to a preferred embodiment, it is desired to use a substantially hydrogen-free raw material as a glass precursor for silica also. Most preferably, a combination of substantially hydrogen-free raw material and substantially hydrogen-free fuel is utilized. Typical examples of substantially H-free glass precursors include silicon carbide (SiC), silicon monoxide (SiO), silicon nitride ($Si_3N_4$), silicon tetrabromide ($SiBr_4$), silicon tetrachloride ($SiCl_4$), silicon tetraiodide ($SiT_4$) and silica ($SiO_2$). $Si(NCO)_4$ may also be utilized.

In accordance with the invention, when carbon monoxide, for example, is used as the fuel and combined with oxygen, the only by-product is carbon dioxide. This by-product is easily disposed of and, advantageously, no water is formed from the process reaction. This reaction is illustrated by the following equation (3).

$$CO+\tfrac{1}{2}O_2 \rightarrow CO_2 \quad (3)$$

It was recognized by the inventors herein that the available heat from carbon monoxide is about one-fourth the heat available from natural gas (methane). Therefore, four times the fuel would be required to produce the same amount of heat. However, only one-half mole of combustion supporting oxygen is required to combust one mole of CO. Thus, the total volume of oxygen required is the same for either fuel to produce the same amount of heat. The following equation (4) shows the required carbon monoxide fuel needed to match the available heat of combusting one mole of methane ($CH_4$) used in one prior art process.

$$4CO+2O_2 \rightarrow 4CO_2 \quad (4)$$

Equation (5) below shows the by-products and combustion supporting oxygen needed for combustion of one mole of methane in the prior art.

$$CH_4+2O_2 \rightarrow 2H_2O+CO_2 \quad (5)$$

Thus, from the foregoing, it should be recognized that the production of substantially water-free silica soot, preforms and glass is obtainable, provided the burners are properly designed.

According to one embodiment of the invention, a method of manufacturing an optical fiber preform is provided. The method comprises the steps of generating heat from a combustion burner having a flame produced by igniting a substantially hydrogen-free fuel, flowing a glass precursor into the flame to produce silica-containing soot, and then depositing the silica-containing soot onto a rotating substrate. To further minimize the inclusion of water in the preform, the preform is preferably included within a substantially water-free atmosphere during the step of depositing. The substantially water-free atmosphere may be a shroud or supply of dry air, dry nitrogen, dry oxygen, dry argon, dry helium, dry carbon dioxide, and combinations thereof.

In another embodiment of the invention, a method of manufacturing a silica-containing soot preform is provided comprising a step of heating at least one end of the preform with at least one end burner wherein the at least one end burner combusts a substantially hydrogen-free fuel. It should be recognized that utilizing end burners that combust a substantially hydrogen-free fuel also minimizes incorporation of water into the preform. Advantageously, these end burners may be utilized in combination with the substantially H-free fuel provided to the soot-producing burner as well as in combination with providing a substantially water-free environment.

According to another embodiment of the invention, a method of manufacturing an optical fiber preform is provided wherein a combination of conventional deposition methods (using hydrogen-containing fuels) and substantially dry deposition methods are employed. In particular, a first combustion burner generates heat from a first flame produced by igniting a hydrogen-containing fuel or a substantially hydrogen-free fuel. A first glass precursor is flowed into the first flame to lay down a first segment of silica-containing soot within the preform. Next, heat from a second combustion burner having a second flame produced by igniting the other one of the hydrogen-containing fuel, and the substantially hydrogen-free fuel is produced. A second glass precursor is flowed into the second flame to lay down a second segment of silica-containing soot. In this way, a multiple-segment preform may be efficiently manufactured in a single lathe without having an intermediate consolidation step. This so-called single step method of forming a preform has long been sought after in the OVD arts. Glassy barrier layers, as will be described in detail herein, are preferably employed to minimize migration of water or a dopant between the segments. Moreover, glassy barrier layers may aid in the loss of F during consolidation.

In accordance with another embodiment of the invention, a method of manufacturing an optical fiber preform having at least one glassy barrier layer is provided. The glassy barrier layer is a thin layer of vitrified or partially vitrified glass that minimizes migration of a dopant or water within the preform. In a preferred embodiment, a first soot segment is formed. A first portion of the first soot segment is then vitrified to form the at least one glassy barrier layer. Additionally, prior to consolidation of a remaining portion of the first soot segment, a second soot segment may be deposited on the at least one glassy barrier layer. Multiple glassy barrier layers may also be utilized within a preform.

Another embodiment provides an optical fiber soot preform comprising first and second soot segments and a vitrified barrier layer therebetween. In all cases, the barrier layer preferably has a thickness of less than about 200 µm, more preferably less than about 100 µm, more preferably yet of less than about 30 µm, and most preferably in a range between 10 µm and about 200 µm. The barrier layers may be formed by a variety of methods as described herein. Laser and Induction heater methods and apparatus for forming the glassy barrier layer are described herein.

A method for producing an optical fiber preform of another embodiment of the invention comprises generating a flame from a combustion burner by igniting a substantially hydrogen-free fuel, flowing into the flame either a silicon-and-fluorine containing precursor or a silicon precursor and a separate fluorine or fluorine-containing compound thereby producing fluorine-doped, silica-containing soot. The soot is then deposited onto a substrate to form an optical fiber preform. Preferably, the silicon-and-fluorine containing precursor is selected from a group consisting of $SiF_4$ and chlorofluorosilanes. The separate fluorine or fluorine-containing compound is preferably selected from a group consisting of $F$, $F_2$, $CF_4$, $C_2F_6$, $SF_6$, $NF_3$, and combinations thereof. The substantially hydrogen-free fuel may be any of those described before.

In accordance with another embodiment of the invention, a method of forming a silica-containing soot is provided wherein a chlorine, fluorine, and silica containing glass precursor is reacted. According to the method, the silica-containing soot is generated by reacting, preferably in a flame, a chlorine, fluorine, and silica containing compound in a deposition (laydown) process. The reaction results in generation of a fluorinated silica-containing soot. Most preferably, the chlorine, fluorine, and silica-containing compound comprises a chlorofluorosilane. Exemplary embodiments include $SiCl_3F$, $SiCl_2F_2$, or $SiClF_3$. In a preferred embodiment, the chlorine, fluorine, and silica containing compound is mixed in gaseous form with a dilutent gas prior to the step of reacting thereby readily enabling the control of the amount of fluorine contained in the soot.

A method for producing a vitrified glass article is provided in another embodiment of the invention. The inventive method comprising several steps. First, heat is generated from a combustion burner having a flame produced by igniting a substantially hydrogen-free fuel. According to the invention, the flame is the only source of heat. Next, a glass precursor is flowed into the flame to produce silica-containing soot. Finally, the silica-containing soot is deposited onto a substrate and substantially simultaneously converted (by the heat of the flame) to form the vitrified glass article by the heat of the flame. In a preferred embodiment, soot is deposited onto a silica-containing glass member, such as a High Purity Fused Silica (HPFS) puck. According to this method, the vitrified glass article contains very low amounts of water. The step of depositing preferably takes place within a chamber that may include a purge gas, such as nitrogen provided thereto. This method is adapted for producing HPFS glass, for example, that may be used in photomask applications.

According to another embodiment, a combustion burner is provided. The burner is adapted for forming silica-containing soot, vitrified glass, and optical fiber soot preforms. The burner comprises a fume passage adapted to supply, at a first flow rate, a glass precursor, and a fuel passage surrounding the fume passage, the fuel passage adapted to supply a substantially hydrogen-free fuel at a flow rate at least 20 times the first flow rate. The burner may also include an inner shield passage between the fuel passage and the fume passage adapted to supply at least oxygen. The burner may further comprise an outer shield passage surrounding the fuel passage for introduction of additional gasses.

In accordance with another embodiment of the invention, a method of producing a fluorine-doped article is provided. The method comprises the step of depositing fluorinated, silica-containing soot containing greater than 0.5% by weight of fluorine by supplying into a flame, in an amount less than 0.5 liters/minute, a fluorine or a fluorine-containing compound. According to this embodiment, efficient incorporation of fluorine onto the soot preform is accomplished. Preferably, the fluorine is included in the silica-containing soot in an amount greater than 1% by weight. The fluorine or fluorine-containing compound may be supplied from an expelling element into the flame or incorporated directly in a fluorine-containing glass precursor, for example, chlorofluorosilane. Most preferably, the flame combusts a substantially hydrogen-free fuel, such as carbon monoxide or the other substantially-hydrogen free fuels, and the fluorine-doped soot is formed within a substantially water-free atmosphere.

According to another embodiment of the invention, a method of manufacturing an optical fiber preform is provided. The method includes a step of depositing soot onto a substrate within a substantially water-free atmosphere. The substantially water-free atmosphere preferably is dried air containing less than about 1000 ppm water vapor, more preferably less than 100 ppm water vapor, more preferably less than 10 ppm water vapor, more preferably yet less than 3 ppm water vapor, and most preferably less than 1 ppm water vapor. The substantially water-free atmosphere may be dry nitrogen, dry argon, dry helium, or combinations thereof or dry oxygen, dry carbon dioxide, or combinations thereof. In accordance with another measure, the substantially water-free environment preferably comprises less than 1% relative humidity at a temperature range between about $-67°$ C. and about $125°$ C. It should be recognized that any significant reduction in the atmospheric water supplied to the preform may advantageously reduce the length of later drying steps.

In another method of manufacturing an optical fiber preform in accordance with the invention, a soot preform is transferred while subjecting the soot preform to a substantially water-free atmosphere. Thus, the preform is not contaminated with water in the transfer step while in transit to additional production operations such as from deposition to a consolidation furnace or holding furnace. In accordance with the invention, a soot preform is formed at a first location. The preform is then transferred to a second location for further processing and during such transfer, subject to a substantially water-free atmosphere. During the transfer, the preform is preferably inserted into a carrier container. Most preferably, the carrier container is subjected to a purge of substantially dry gas, such as dried air, dry nitrogen, dry oxygen, dry argon, dry helium, dry carbon dioxide, and combinations thereof.

A method of producing silica soot in accordance with another embodiment of the invention comprises a step of supplying a combination of combustion-enhancing fuel additive and substantially hydrogen-free fuel to a burner. Preferably, the substantially hydrogen-free fuel is selected from a group consisting of carbon monoxide (CO), carbon suboxide ($C_3O_2$), and carbonyl sulfide (COS). The combustion-enhancing fuel additive is preferably a catalyst, an energetic fuel, or an energetic oxidizer. These additives either increase the burning speed of the substantially hydrogen-free fuel or increase the flame temperature. This advantageously improves the flame's burning rate, heat, and structure. The combustion-enhancing fuel additive is preferably supplied in an amount of less than about 50% by volume of the substantially hydrogen-free fuel, more preferably less than about 20%, more preferably yet less than 5%, and most preferably less than about 1% by volume of the substantially hydrogen-free fuel. It was discovered by the inventors hereof that small amounts of such additives (less than 5% of substantially hydrogen-free fuel) are needed to increase the burning speed of the substantially hydrogen-free fuel such that the flame remains properly attached to the burner. Larger amounts may be needed when depositing certain dopants, such as germania, to achieve the desired dopant concentrations in the soot.

DETAILED DESCRIPTION OF THE INVENTION

Figure 1:
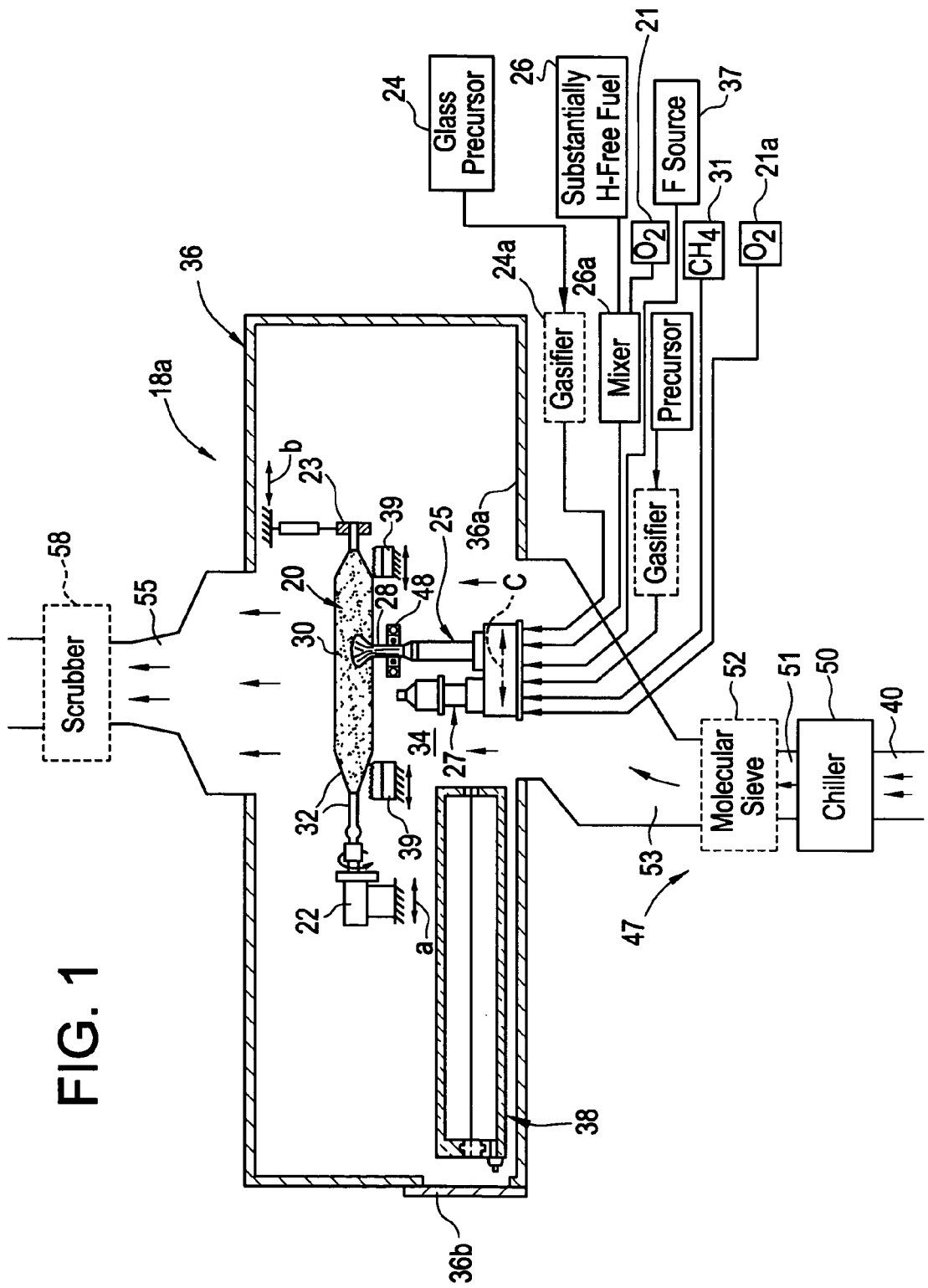
FIG. 1 illustrates a schematic depiction of an apparatus and method in accordance with the invention for forming substantially water-free optical fiber soot preforms.

Reference will now be made in detail to the present preferred embodiments of the invention with reference to the attached drawings. Wherever possible, the same or similar reference numerals shall be used throughout to refer to the same or like parts.

According to a first embodiment of the present invention, a method and apparatus of manufacturing a substantially water-free optical fiber soot preform 20 is provided. As best illustrated in FIG. 1, the method for forming the soot preform 20 comprises the steps of generating heat from a combustion burner 25 (the details of several desirable burners are described with reference to FIGS. 21 and 31) having a flame 28 produced by igniting a substantially hydrogen-free fuel 26, flowing a glass precursor 24 into the flame 28 to produce a silica-containing soot 30, and depositing the soot 30 onto a rotating substrate 32. The substantially hydrogen-free fuel 26 may vary widely. Examples include carbon monoxide (CO), carbon suboxide ($C_3O_2$), carbonyl sulfide (COS), and the like.

The glass precursor 24 is provided to the burner 25 and is oxidized in the flame to form the soot. The glass precursor 24 is preferably also substantially hydrogen-free and may vary widely. Typical examples include silicon carbide (SiC), silicon monoxide (SiO), silicon nitride ($Si_3N_4$), silicon tetrabromide ($SiBr_4$), silicon tetrachloride ($SiCl_4$), silicon tetraiodide ($SiI_4$), silica ($SiO_2$), and $Si(NCO)_4$.

Figure 21:
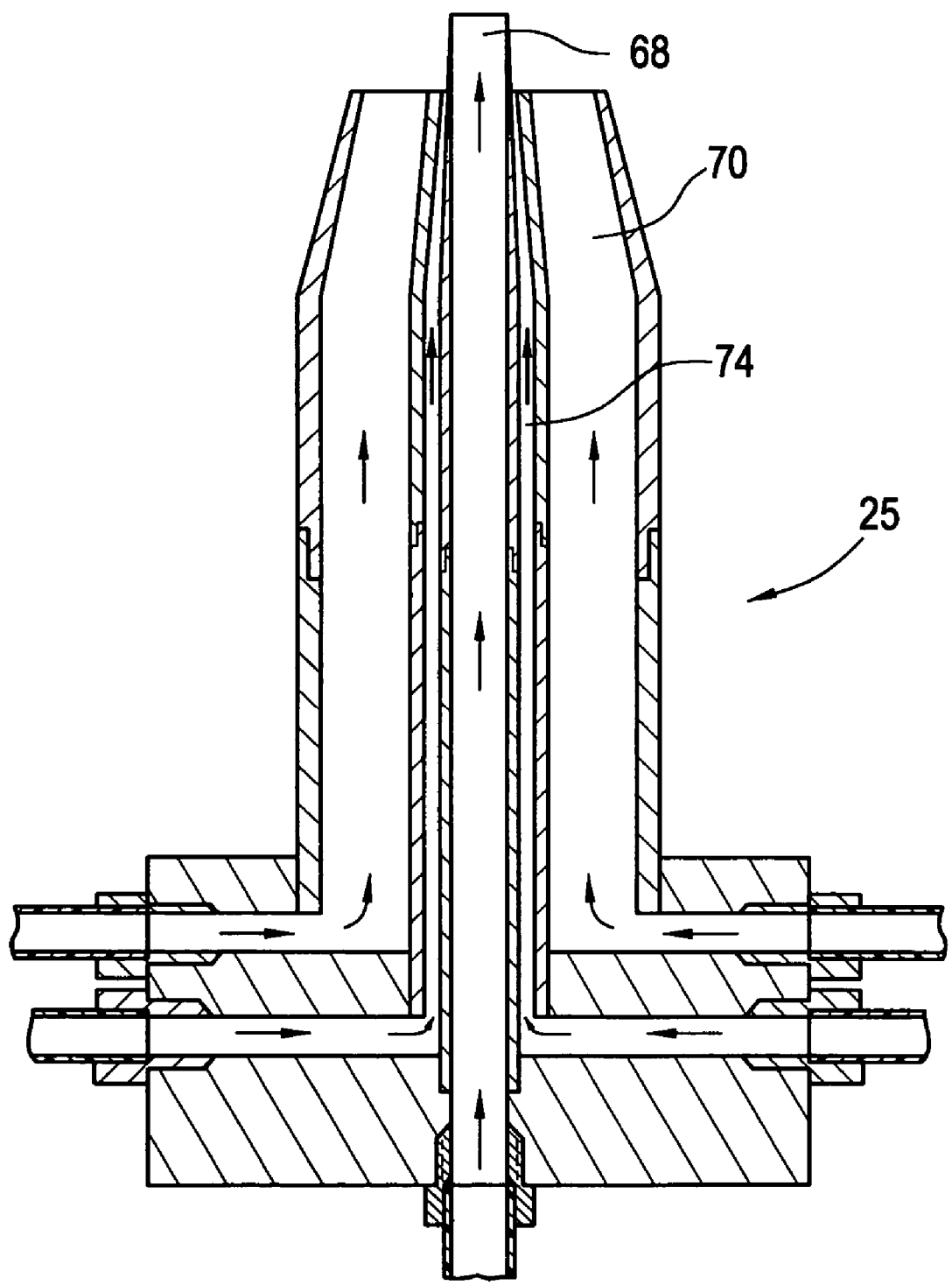
FIG. 21 illustrates a cross-sectional side view of a combustion burner apparatus in accordance with an embodiment of the invention.

The glass precursor 24 for producing the core soot region of the preform 20 may preferably include an additional compound selected from a group consisting of a germanium-containing compound such as $GeCl_4$, a fluorine-containing compound such as silicon tetrafluoride ($SiF_4$), or other suitable up or down dopants to enable obtaining the desired refractive index profile. Most preferably, the glass precursor 24 utilized to form fluorine doped soot 30 in the preform 20 is a compound that is selected from a group consisting of fluorohalocarbons, chlorofluorosilanes, $CF_4$, or $SiF_4$, $NF_3$, $SF_6$, and combinations thereof. Preferably, the precursor 24 is provided in gaseous form to the burner 25. Although if a liquid burner is utilized, the fuel may be supplied in liquid form. An optional gasifier apparatus 24a gasifies the liquid precursor, if stored in liquid form. For example, $SiCl_4$, $GeCl_4$, $Si(NCO)_4$, and $Ge(NCO)_4$ precursors are provided in liquid form at room temperature and therefore require gasification. Any known method of gasification may be employed, such as heating the precursor and bubbling a carrier gas (such as $N_2$, $O_2$, Ar, or He) through it. Although, the burner illustrated in FIG. 21 is preferred, optionally a liquid atomizing burner, such as described in WO 99/32410 filed Dec. 3, 1998 and entitled "Burner And Method For Producing Metal Oxide Soot" may be employed. The substrate 32 onto which the soot is deposited comprises, during the startup of deposition, a rotating alumina bait rod or a glass core cane, and thereafter when some soot has been deposited, the substrate becomes the soot already deposited.

The substrate is preferably rotated by a motor 22 and is supported at the other end by any suitable end support member 23, such as a V-block, which allows rotation and provides radial motion restraint. The end support 23 and motor 22 are mounted to a common frame member which preferably traverses back and forth relative to the housing 36 as indicated by double ended arrows "a" and "b" thereby moving the bait rod and soot preform 20 transversely along its axial axis relative to the soot generating burner 25. Optionally, the burner 25 may be traversed back and forth as indicated by dashed arrow "c" while soot preform 20 is held stationary along the transverse axis and is simply rotated. The preferred rotation speed in accordance with the invention is about 180 rpm. In a preferred embodiment, preferably at least a portion of the combustion burner 25 is mounted within chamber 36a of the housing 36.

Fluorine And Substantially H-Free Fuel Combination

According to another embodiment of the invention, a method for producing an optical fiber preform is provided comprising the combination of fluorine doping and utilizing a burner that combusts a substantially H-free fuel. In particular, the use of a dry combustion source minimizes the water (H and OH) within the soot and, thus, the propensity of the highly mobile fluorine molecule from moving around through the soot matrix. In particular, as shown in FIG. 1, the method includes generating a flame 28 from a combustion burner 25 by igniting a substantially hydrogen-free fuel 26, flowing into the flame, a silicon-and-fluorine containing precursor 24 or a silicon precursor 24 and a F source 37 such as fluorine or fluorine-containing compound whereby a fluorine-doped, silica-containing soot is produced, and depositing the soot onto a substrate 32 to form a fluorine-doped optical fiber preform. In one species, the silicon-and-fluorine containing glass precursor 24 further comprises chlorine. Preferably, the substantially hydrogen-free fuel 26 comprises carbon monoxide. However, any of the other aforementioned substantially hydrogen-free fuels may be utilized. Exemplary embodiments of the separate fluorine or fluorine-containing compound 37 are preferably F, $F_2$, $CF_4$, $C_2F_6$, $SF_6$, $NF_3$, and combinations thereof. However, other suitable fluorine-containing compounds may be utilized as well. Most preferably, the silicon-and-fluorine containing precursor 24 is selected from a group consisting of $SiF_4$ and chlorofluorosilanes. Notably, other silicon—and—fluorine containing precursors may be utilized also.

Chlorofluorosilane Precursor

Figure 19:
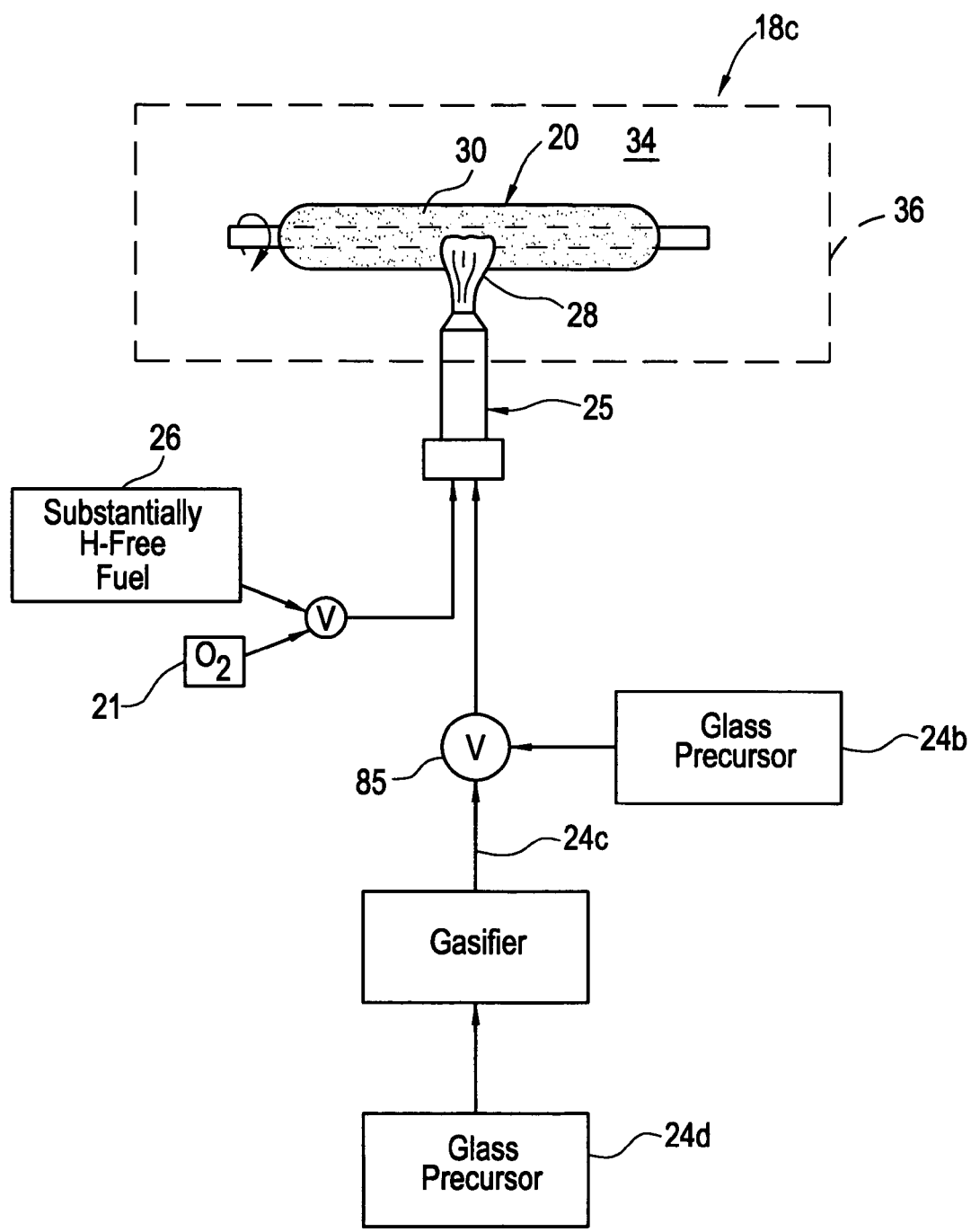
FIG. 19 illustrates a schematic view of multi-segment soot preform being formed in a one step method in accordance with the invention.

One particularly promising class of glass precursor compounds for the formation of silica-and-fluorine containing soot within an optical soot preform 20 are chlorine, fluorine, and silica containing compounds. According to one method and apparatus for producing silica-containing soot, as shown in FIG. 19, in a deposition lathe 18c, a chlorine, fluorine, and silica containing compound 24b is chemically reacted and oxidized, preferably in a flame 28 of a combustion burner 25, during deposition; the reaction resulting in the generation of a fluorinated silica-containing soot 30. The fluorinated soot is utilized to form a fluorinated segment within an optical fiber preform 20, such as a core portion or a clad segment.

Preferably, the soot 30 is formed by reacting the precursor 24b in a flame 28 formed by igniting a substantially hydrogen-free fuel, such as CO, in the presence of a combustion supporting gas 21. This, as should now be recognized, forms substantially water-free fluorine-doped soot. As before, any of the afore-mentioned substantially H-free fuel alternatives may also be employed. Suitable valves such as Mass Flow Controllers (MFCs) control the flows of fuels and compounds herein. Most preferably, forming the fluorinated silica-containing soot 30 occurs within a substantially water-free atmosphere 34 provided within a housing 36, such as has been shown and described with respect to FIG. 1, for example.

Figure 23:
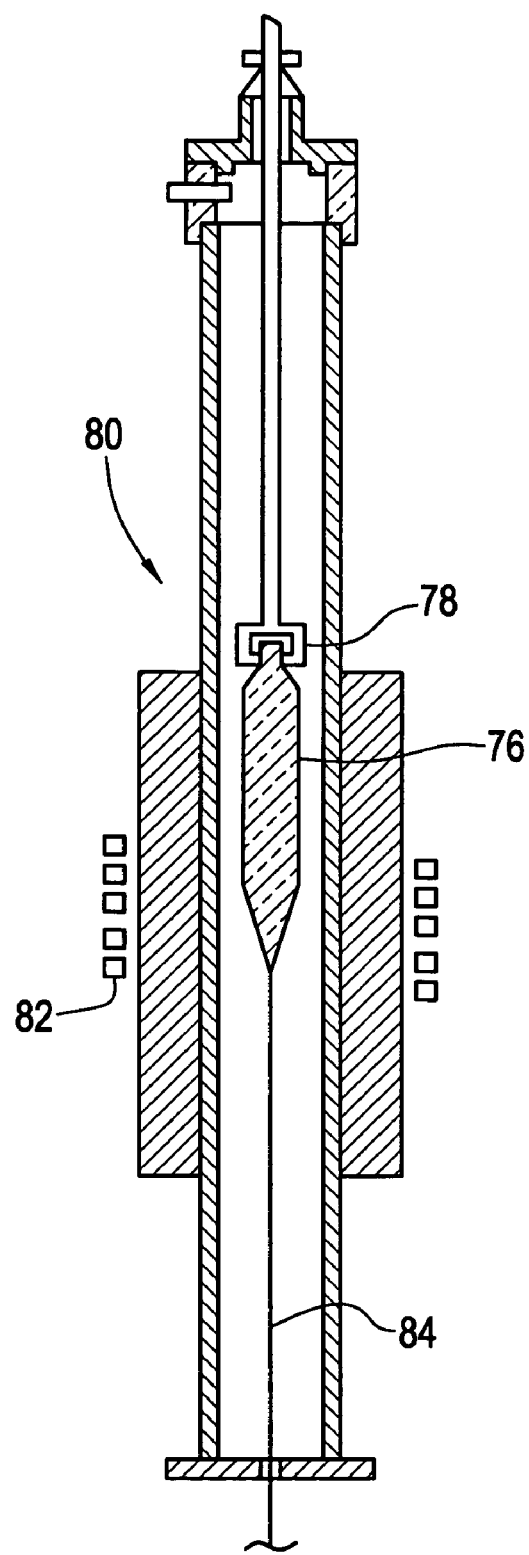
FIG. 23 illustrates a partially cross-sectional side view of a optical fiber draw apparatus in accordance with an embodiment of the invention.

As in the previously mentioned embodiments, the fluorinated silica-containing soot 30 is deposited onto a preferably rotating substrate to form a soot preform 20. The soot preform 20 is then dried and sintered in accordance with conventional methods or the methods described herein with reference to FIGS. 16 and 17. After being vitrified into a glass preform 76 (FIG. 23), the preform is connected to a handle 78, lowered into a draw furnace 80 and heated by the heat source 82 causing the lower end of the preform 76 to soften. The softened glass falls from the preform 76 as a gob and is threaded through the various components of the draw apparatus (only a portion of which is shown). Once threaded, down feed mechanisms (not shown) draw the glass fiber 84 from the preform 76 at precisely the desired rate to produce the proper diameter fiber. More details of fiber drawing may be found in U.S. Pat. No. 5,284,499.

Again referring to FIG. 19, the chlorine, fluorine, and silica containing compound illustrated as the glass precursor 24b in gaseous form is preferably mixed with a dilutent gas 24c prior to the step of reacting. The step of mixing the chlorine, fluorine, and silica containing compound 24b with a silica-and-chlorine containing compound 24c is performed to adjust and/or achieve a desired level of fluorine in the soot. The mixing is performed by suitable valves or mass flow controllers 85. In a preferred embodiment, the dilutent gas is a glass precursor 24d, such as a silica-and-chlorine compound, for example $SiCl_4$ that has been gasified by gasifier. Preferably, the chlorine, fluorine, and silica containing compound 24b comprises a chlorofluorosilane. Exemplary embodiments include $SiCl_3F$, $SiCl_2F_2$, and $SiClF_3$. Other embodiments may be utilized as well. By utilizing the chlorine, fluorine, and silica containing compound, the fluorinated silica-containing soot may be made to contain greater than about 0.5% by weight of fluorine, and more preferably greater than 1% by weight.

Dry End Burner

Figure 33:
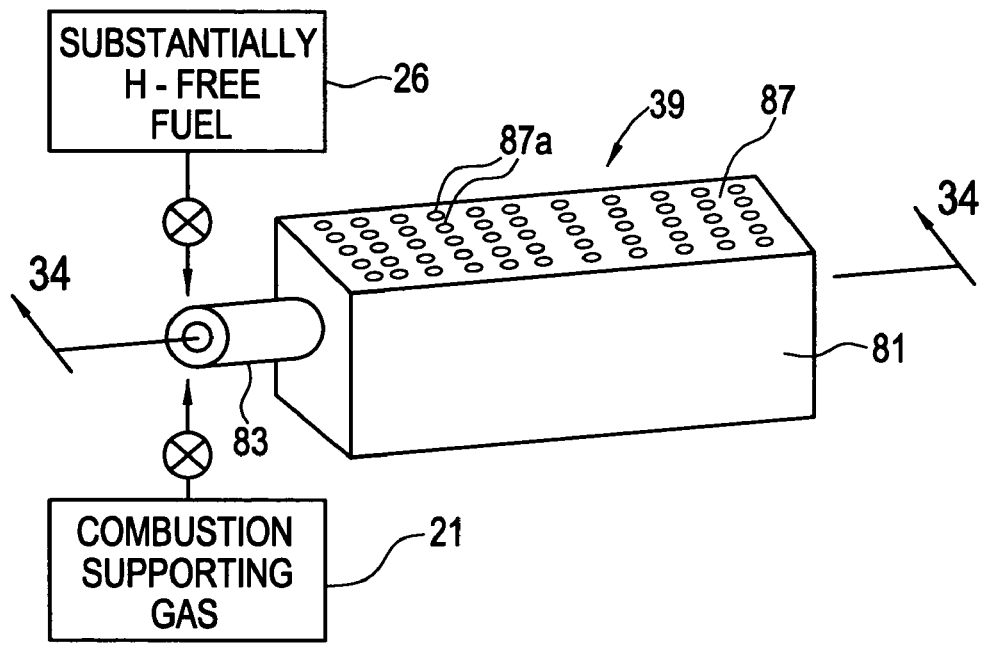
FIG. 33 illustrates a perspective view of an end burner in accordance with an embodiment of the invention.
Figure 34:
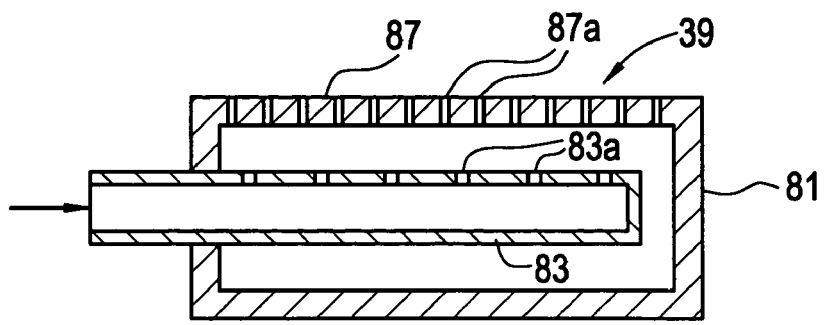
FIG. 34 illustrates a side cross-sectional view of an end burner along line 34—34 of FIG. 33.

End burners 39 as illustrated in FIGS. 1 and 33–34 are also preferably included within the chamber 36a. The flames thereof are directed at the unusable ends of the soot preform 20 and function to prevent crazing and thermal shock in the preform 20. At least one end burner 39 in accordance with another embodiment of the invention (as shown in FIG. 33 and 34) is preferably supplied with, and operates on, at least a substantially hydrogen-free fuel 26, such as carbon monoxide. Flow rates of about 15–20 liters per minute of CO have been utilized, for example. The substantially hydrogen-free fuel 26 is preferably mixed and used in combination with a combustion supporting gas, such as oxygen. Flow rates of oxygen to the burner are preferably 5–7 liters per minute. As shown in FIG. 33 and 34, the end burners 39 preferably comprise a hollow box-like burner housing 81 with a closed end tube 83 inserted and sealed therein. Gas flows pass into the tube 83 and out through a plurality of distribution ports 83a, approximately seven having diameters of between about 0.040 inch (1.02 mm) and 0.080 inch (2.03 mm) that are spaced equally along the tube. The gas then flows out through the face ports 87a formed through the face 87 of the burner housing 81. The face ports 87a preferably have a diameter of about 0.046 inch (1.17 mm) and there are 50–100 ports depending upon the size of the preform and which end of the preform. The gas flowing out of the ports 83a is ignited to form the end burner flames.

As is illustrated in FIG. 1, most preferably the burners 39 are supplied at both ends of the preform and both operate on a substantially hydrogen-free fuel. The supply system to the end burners is not illustrated for clarity, but is preferably of conventional construction. The end burners 39 preferably are mounted to the aforementioned frame member such that they are stationary relative thereto. Thus, the burners 39 are continuously substantially aligned with the respective ends of the preform 20. The use of end burners 39 that operate on substantially hydrogen-free fuel is another mechanism to minimize generation of, and thus exposure of the preform 20 to water vapor thereby resulting in drier soot. In a variant system, where the burner reciprocates, the end burners would be stationary.

Substantially Water-Free Atmosphere

In accordance with another embodiment of the invention, in order to prevent infiltration of water (H, OH, $H_2O$) into the soot preform 20 from moisture in the atmosphere, the preform 20 is preferably included in or otherwise exposed to a substantially water-free atmosphere 34 during the step of depositing. The exposure is preferably accomplished by including the preform within a chamber 36a of a housing 36 or to a shroud of the substantially water-free atmosphere. The substantially water-free atmosphere is then supplied to the housing by a substantially dry environment supply system 47. The substantially water-free atmosphere 34 is preferably selected from a group of dry gasses such as dried air, dry nitrogen, dry oxygen, dry argon, dry helium, dry carbon dioxide, or combinations thereof. However, any suitable substantially dry environment may be employed such that low levels of water vapor are present therein.

In particular, one preferred method and apparatus (shown in FIG. 1) of providing a substantially water-free environment in accordance with the invention is accomplished by passing a supply gas 49, such as outside or room air, through a chilling apparatus 50. The chiller 50 reduces the temperature of the supply gas 49 to approximately −40° C. This apparatus 47 can readily reduce water content in the supply gas to a first humidity level of less than about 1000 ppm water vapor. Optionally, the chilled supply gas 51 may be passed through a molecular sieve apparatus 52 if it is desirable to remove further water vapor. Upon exiting the sieve 52, the substantially water-free atmosphere having a second humidity level is provided through an input duct 53 into the chamber 36a of housing 36.

The flow of the shroud of substantially water-free gas flows over the burner 25 and preferably over the entire length of the preform 20. The velocity of the flow is preferably sufficiently low such that a uniform and laminar flow is supplied to the preform 20. A flow rate of between about 150–500 cfm, and more preferably between 200–350 cfm is desirable. The flow of dry gas continues across the preform 20 and exits through exhaust 55 carrying with it any non-deposited by-products of the soot formation reaction and fuel ignition, such as $CO_2$, $SiO_2$, and $GeO_2$. An optional scrubber 58 may be employed to reclaim or remove any particulate matter or remove any undesirable reaction by-products. This may comprise one or more pieces of equipment.

It should be recognized that this embodiment of the invention whereby a substantially water-free environment 34 is provided to the preform 20 during deposition may be utilized in combination with utilizing substantially hydrogen-free fuel. This combination will have the excellent benefits in terms of minimizing water (H, OH) within the soot preform 20. Moreover, in this combination, advantageously neither the atmosphere nor the combustion process contributes to any appreciable inclusion of water into the soot preform 20.

In more detail, it is preferred that the supply system 47 conditions the supply gas 49 containing water vapor to the point where a significant portion of the water is removed, hence the terms "substantially water-free atmosphere" or "substantially dry atmosphere." Preferably, according to one measure, the water vapor content is less than 1% relative humidity at a temperature range between about −67° C. and about 125° C., and more preferably less than 0.1%. In terms of ppm water vapor, the substantially water-free atmosphere preferably exhibits less than 100 ppm, more preferably less than about 100 ppm water vapor, more preferably, less than about 10 ppm water vapor, even more preferably less than about 3 ppm, and most preferably less than about 1 ppm water vapor. Notably, it should be recognized that any significant reduction in water vapor in comparison to the prior art methane/oxygen technology operating in room humidity levels will reduce the time required for any drying step later in the preform treatment process. Therefore, it should be recognized that the present invention reduces production costs and time to produce a preform from which fiber may be drawn.

Figure 20:
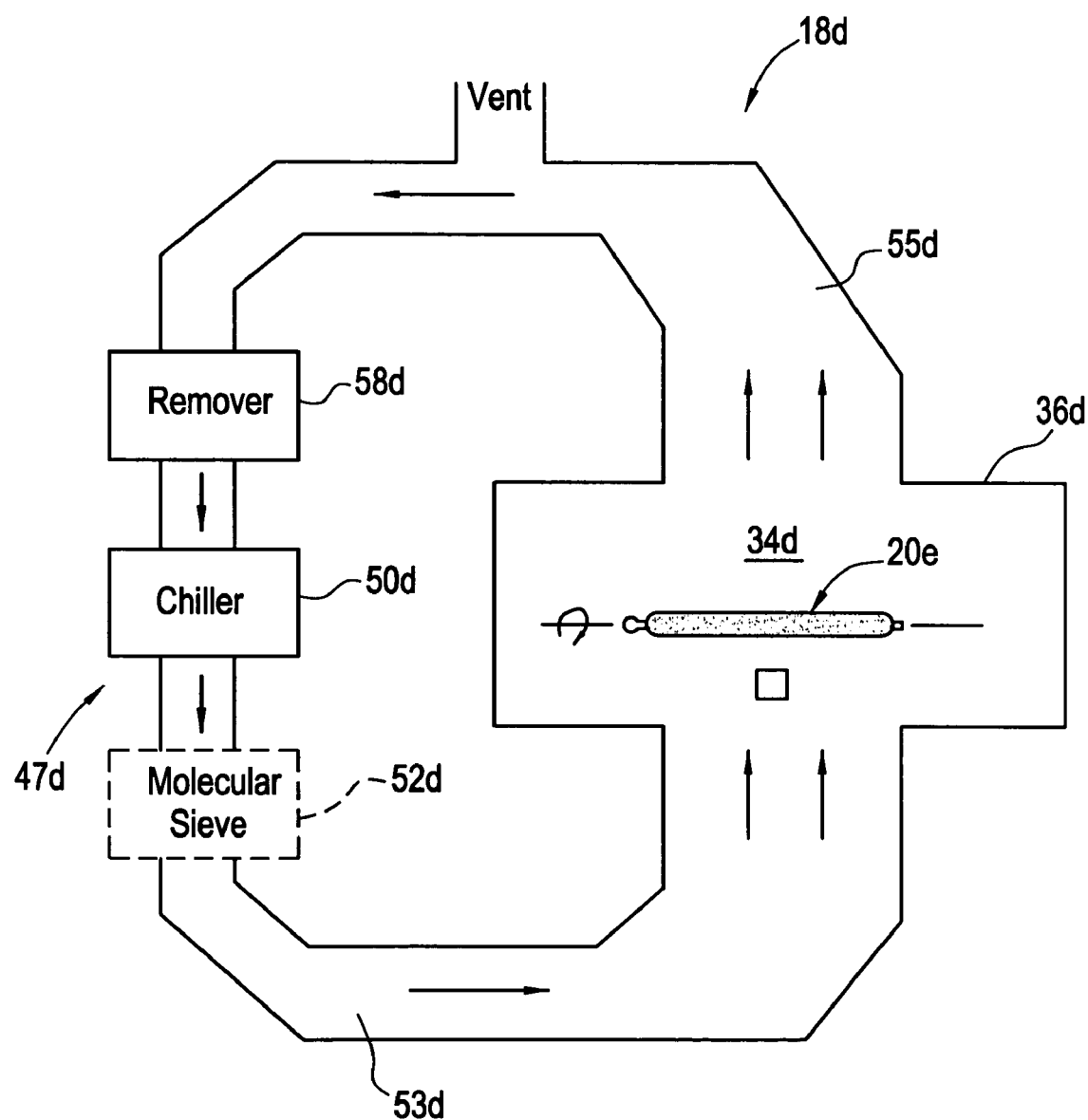
FIG. 20 illustrates a schematic view of an apparatus and method of forming a soot preform wherein the exhaust gasses are recycled.

FIG. 20 illustrates a lather deposition apparatus 18d wherein a soot preform 20e is being formed in a chamber within a housing 36d. Flowing from a supply system 47d is a substantially dry environment 34d. The system 47d includes a chiller 50d and an optional molecular sieve 52d as heretofore mentioned. Also included is a remover 58d which functions to remove various unwanted compounds, gasses and soot materials from the exhaust flow 55d such as, for example, $GeO_2$, $SiO_2$, $Cl_2$, $CO_2$, $COF2$, $F_2$, $SiF_4$, or $CF_4$. The remover unit 58d may comprise one or more pieces of equipment for removing such unwanted exhaust contaminants. For example, particulate matter may be removed by a particulate separator system. Various wet scrubber systems or thermal reactors are available for removing the other compounds and gasses. The main difference in this embodiment as compared to that previously described in FIG. 1 is that the exhaust flow 55d is recycled through the supply system 47d and then redelivered to the supply input 53d. This may have the advantage of allowing the chiller 50d to work more efficiently, as the water vapor levels may already be very low. A vent may be required in the system because of the addition of combustion gasses.

Figure 2:
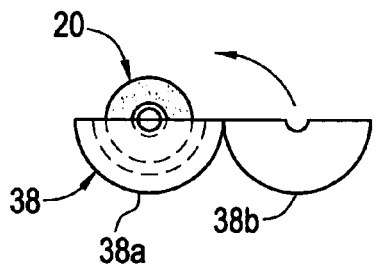
FIG. 2 illustrates an end view of a soot preform mounted within a carrier container.
Figure 3:
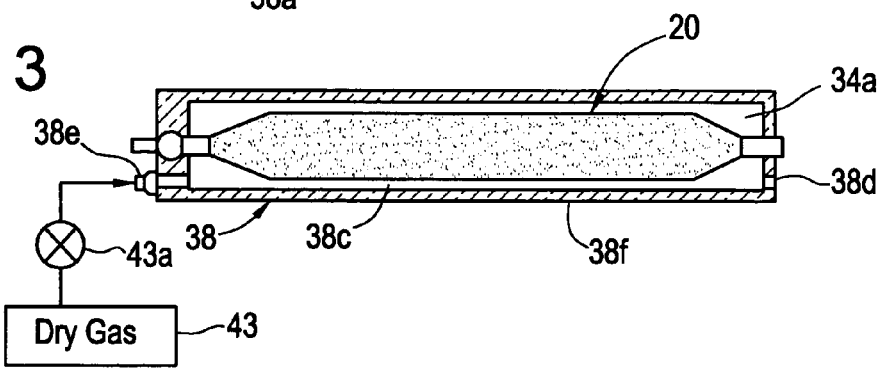
FIG. 3 is a partially cross-sectioned side view of the soot preform positioned within the carrier container of FIG. 2 and being purged with a dry gas.

According to another embodiment of the invention, the soot preform 20 is transferred from the soot deposition chamber 36a to another location for further processing and is preferably included within a substantially water-free atmosphere 34a during this transfer. The transfer may be, for example, to a holding oven or furnace or consolidation or draw furnace or the like. As best illustrated in FIGS. 1, 2 and 3, the preferred method for exposing the preform to substantially dry gas during transfer is illustrated. The method and apparatus comprises inserting the preform 20 into a carrier container 38 that includes a substantially water-free environment 34a. As shown in FIG. 1, the carrier container 38 may be inserted or housed within or otherwise directly connected to the chamber 36a such that the preform may be readily inserted therein. In the illustrated embodiment, the preform 20 is inserted in the carrier 38, then the carrier 38 is closed and removed through an exit door 36b. The carrier 38 may be manufactured from an inert material, for example, a high purity fused silica. The preform 20 is preferably transferred into the carrier container 38 by a robot or manually by an operator utilizing gloves (not shown) sealed to the housing 36 and which traverse into the chamber 36a of the housing. In this way, the preform 20 is always exposed to the substantially water-free environment as it is being loaded into the carrier 38.

Preferably, as illustrated in FIG. 2, the container 38 includes a clam shell construction with opposing halves 38a, 38b. When closed, the preform 20 is housed within and preferably suitably secured between the halves 38a, 38b. The halves, when closed, form a cavity 38c into which the substantially water-free environment 34a is placed. Initially, upon placement of the preform into the cavity 38c, the environment is the same as that provided by the supply system 47 (FIG. 1). Prior to removal of the container from the chamber 36a, a substantially water-free environment 34a is formed by subjecting the preform 20 to a purge of substantially dry gas (FIG. 3). The substantially dry gas purge is continued, preferably substantially continuously, during the step of transferring to the next process. As shown in FIG. 3, the substantially dry gas 43 is provide into one end of the container 38, thus filling the cavity 38c with the substantially dry gas. The substantially dry gas preferably exits through a purge hole 38d on the other end of the container.

The substantially dry gas 43 utilized in the purge is preferably selected from a group consisting of dry air, dry oxygen, dry carbon dioxide, and combinations thereof. Further, dry argon, dry nitrogen or dry helium may be utilized. However, any suitable substantially dry environment may be employed for the purge step. By the term substantially dry gas or substantially dry environment, it is desired that the gas have less than about 1000 ppm water vapor, more preferably less than 100 ppm water, more preferably less than 10 ppm water vapor, more preferably yet less than about 3 ppm water vapor, and most preferably less than about 1 ppm water vapor.

As shown in FIG. 3, during transfer, a canister 43 of substantially dry gas is connected to the container 38 by a suitable fitting 38e. Flow is initiated and controlled by a suitable valve 43a, such that a slight positive pressure in the chamber 38c of container 38 is maintained. This minimizes flow of atmosphere into the chamber 38c.

Figure 14:
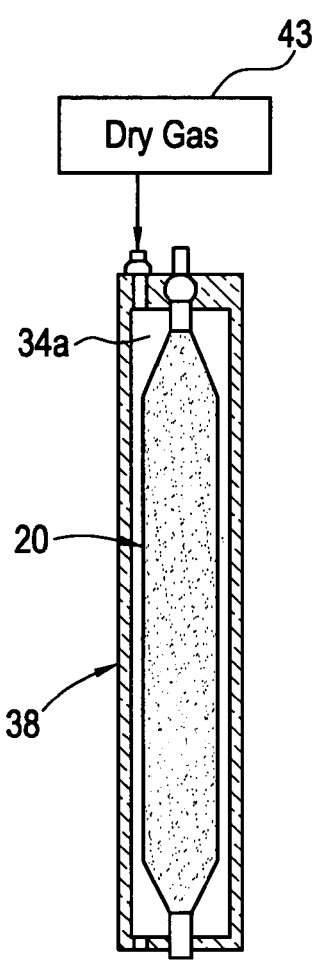
FIGS. 14 and 15 illustrate partially cross-sectioned views of the soot preform mounted in the carrier container with the bait rod inserted and removed, respectively.
Figure 15:
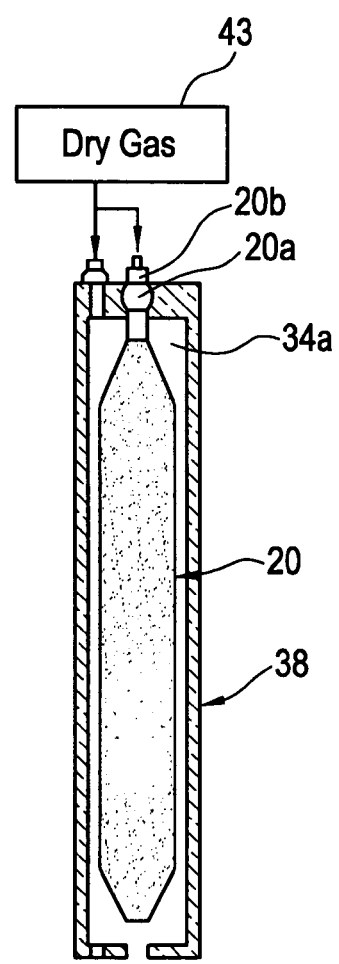

As shown in FIGS. 14 and 15, upon removal or disconnection from the housing chamber 36a, the container 38 and preform 20 are preferably moved to an upright position (FIG. 14) and the bait rod is removed. This leaves the soot preform 20 suspended by handle 20a within the container 38, all the while being subjected to the substantially dry environment 34a provided by dry gas supply 43. Upon removal of the bait rod, it may be desirable to supply dry atmosphere 34a down the centerline aperture formed by attachment of a suitable fitting 20b to handle 20a as shown in FIG. 15.

Figure 16:
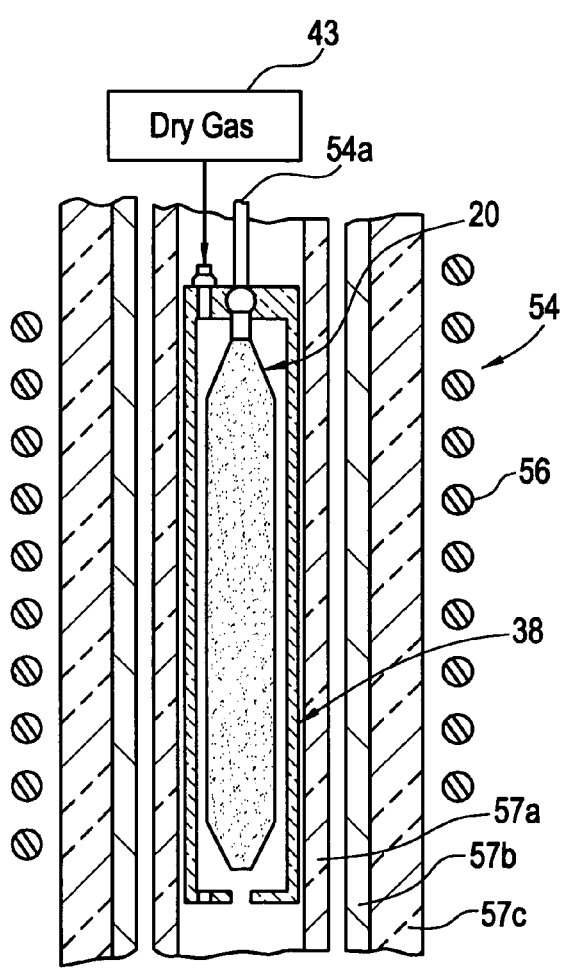
FIGS. 16 and 17 illustrate partially cross-sectioned views of the soot preform inserted within consolidation furnaces.
Figure 17:
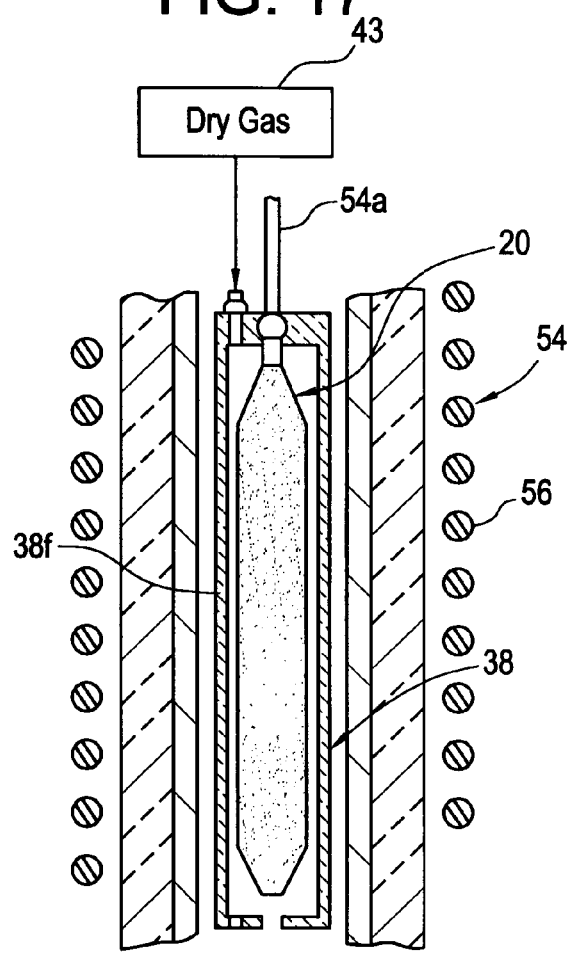

Next, as illustrated in FIG. 16, and in accordance with another embodiment of the invention, the container 38 with preform 20 mounted therein may be lowered into the muffle tube 57a of consolidation furnace 54 by a hollow furnace handle 54a, preferably with the supply of dry gas 43 still attached. The furnace preferably includes a susceptor 57b, insulation 57c, and heat inducing coil 56 as is conventional practice. In accordance with a preferred embodiment of FIG. 17, the aforementioned muffle tube may be entirely replaced with the container 38 made of high purity fused silica, thus eliminating one expensive component from the furnace 54. Thus, it should be recognized that in accordance with this embodiment of FIG. 17, the muffle tube of the consolidation furnace 54 is formed from the wall 38f of the carrier container 38 used to transport the soot preform 20 from the deposition step. However, it should be recognized that the consolidation process of the preform 20 preferably takes place within the container 38 in both of the aforementioned embodiments.

Once the container 38 and preform 20 are properly positioned in the furnace 54, a supply of drying and/or consolidation gasses are then supplied to the furnace 54 preferably through the hollow handle 54a. After this, the supply 43 may be removed. If the aforementioned dry processes have been employed, it may be possible to eliminate the drying step altogether or at least substantially shorten it, as the soot preform has remained substantially dry throughout the steps of deposition and transport. The preform 20 is then consolidated in an atmosphere of helium at between about 1200° C. and 1600° C. to transform the soot preform into a vitrified article. Although, the container 38 is shown in the previous two embodiments as being inserted in the furnace, alternatively, the preform may be quickly removed under, for example a shroud of substantially dry gas and quickly inserted into the consolidation furnace 54. It should also be recognized that when the various inventive features described herein are employed either individually or in combination, the length of the drying time is substantially reduced and may be eliminated. This reduces the total process time for producing consolidated preforms and the amount of chlorine that needs to be utilized. In addition, better attenuation characteristics are conceivable.

According to the invention, and again referring to FIG. 1, the substantially hydrogen-free fuel 26 utilized and provided to the burner 25 preferably comprises carbon monoxide. By the term, substantially hydrogen-free fuel, what is meant is that no hydrogen is present in the general chemical structure and that low amounts of contaminants (less than about 0.5%) are present, such as water. A combustion supporting gas 21, such as oxygen, is preferably mixed with the hydrogen-free fuel in gaseous form by a mixing apparatus or other suitable flow controls 26a. Oxygen is preferably mixed with CO in a ratio of about 2:1, for example.

Dry fluorine-doped soot may be generated in accordance with another embodiment of the invention. Fluorine doped, silica-containing soot 30 is preferably generated by flowing fluorine or a fluorine-containing compound into the flame 28 produced by igniting a substantially-hydrogen free fuel 26. The step of flowing may be accomplished by flowing fluorine or a fluorine-containing compound directly into the flame 28 from a fluorine source 37 or by incorporating the fluorine or fluorine-containing compound into or as an integral part of the chemical structure of the glass precursor 24. The fluorine-containing compound is preferably selected from a group consisting of $F_2$, $CF_4$, $C_2F_6$, $SF_6$, $NF_3$, $SiF_4$, chlorofluorosilanes, chlorofluorocarbons, and combinations thereof.

Figure 12:
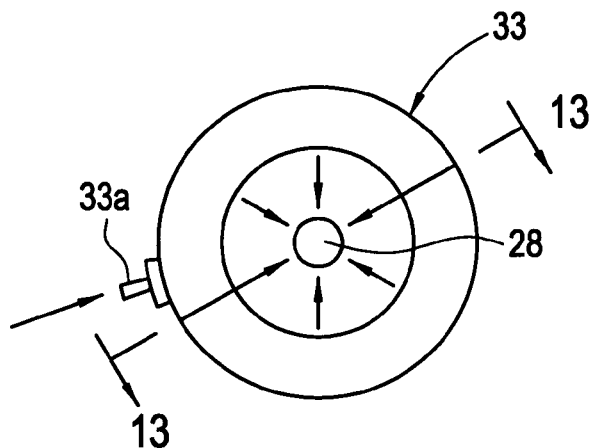
FIG. 12 illustrates a top view of a ring for dispensing generally radially directed streams of fluorine into the burner flame.
Figure 13:
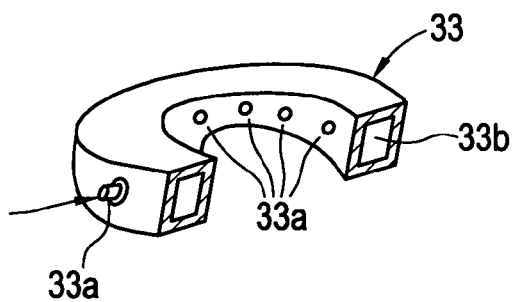
FIG. 13 illustrates a cross-sectioned isometric view of the ring taken along section line 13—13 of FIG. 12.

In one embodiment, within the lather deposition apparatus 18a, the fluorine or fluorine-containing compound is flowed into the flame 28, from an expelling element 48 at least partly surrounding the flame 28 as shown in FIGS. 1, 12 and 13. The fluorine or fluorine-containing compound is provided by suitable tubing (not shown) to an input connection 33a on the hollow annular ring 33. The fluorine or fluorine-containing compound is distributed around a hollow annular channel 33b in the ring 33 and is expelled from a plurality of radially inward directed ports 33c formed in the ring 33. The ports 33c may include a sight upward component as well.

Figure 31:
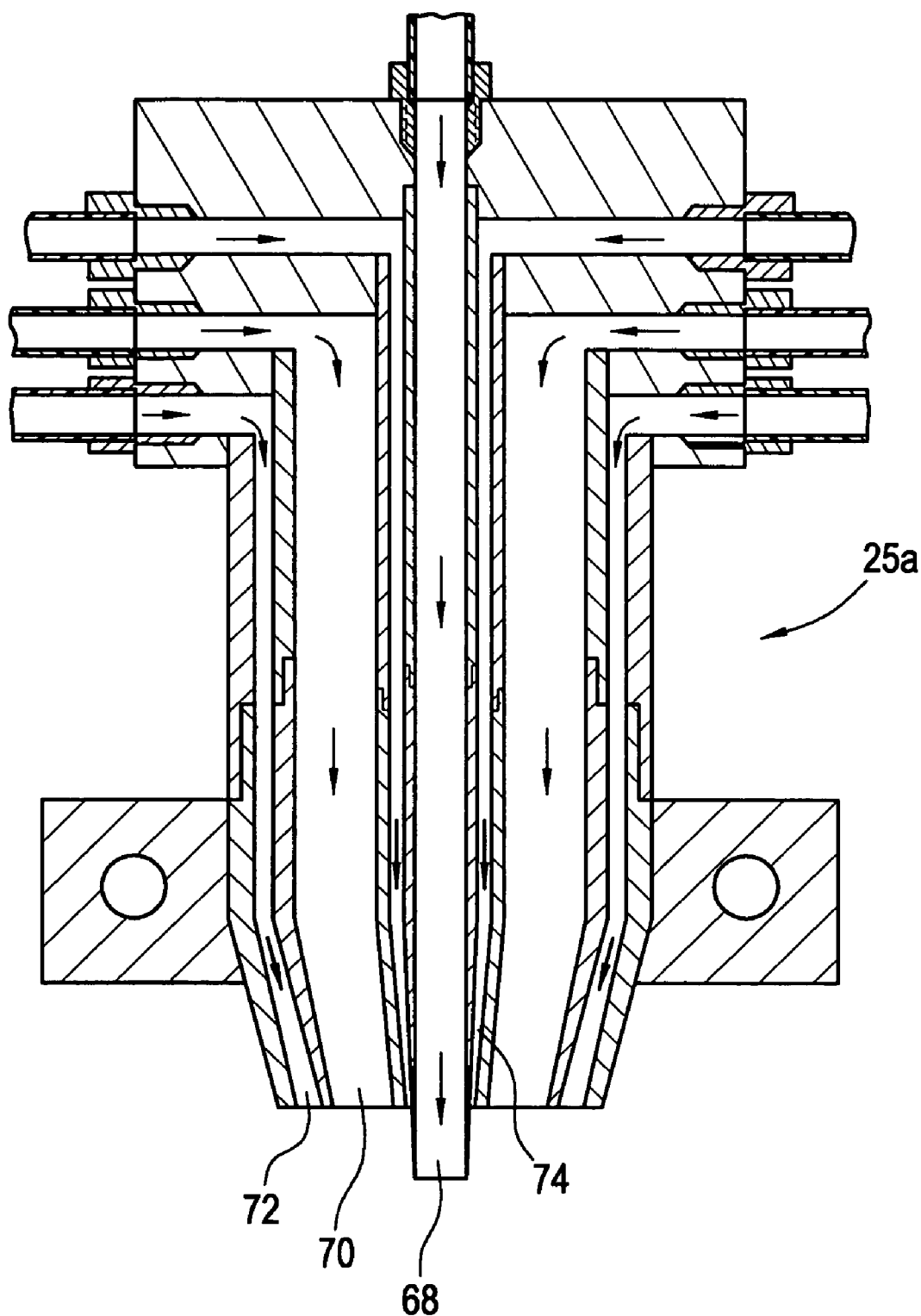
FIG. 31 illustrates a detailed cross-sectional side view of the combustion burner apparatus of FIG. 30 in accordance with an embodiment of the invention.

Optionally, the fluorine or fluorine containing-compound may be emitted from an outer shield included within the combustion burner 25 as will be described with reference to FIG. 31.

Figure 4:
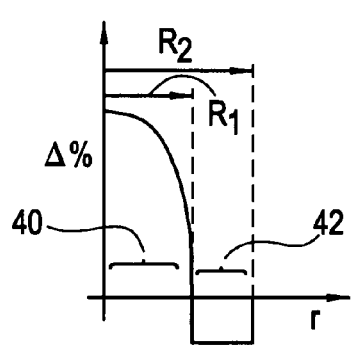
FIGS. 4–7 illustrate various examples of refractive index profiles that may be manufactured in accordance with the present invention.
Figure 8:
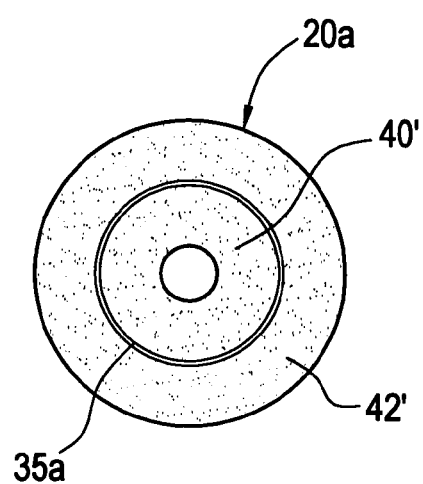
FIGS. 8–11 illustrate various cross-sectional end views of preforms manufactured in accordance with the invention that include barrier layers.

It should be understood that the use of a substantially hydrogen-free fuel 26, such as carbon monoxide, enables manufacture of fiber profiles that heretofore had to be manufactured with detailed multi-step processes. Therefore, use of the process in accordance with the invention reduces manufacturing cost and process time. According to an exemplary embodiment of the invention whose refractive index profile is shown in FIG. 4, a first segment 40 including silica-containing soot is laid down onto the rotating substrate 32 as shown in FIG. 1. The first soot segment 40', as shown in FIG. 8, preferably includes a dopant such as a germania dopant to produce the desired refractive index profile in the consolidated preform and, thus, in the end product optical fiber. Next, a second soot segment 42' of preform 20a is laid down by a deposition adjacent to the first soot segment 40'. Preferably, the second soot segment 42' includes a fluorine dopant thereby depressing the refractive index of segment 42 (FIG. 4) below that of pure silica and creating a moat region in the profile. It should be recognized that these two segments may be deposited one after another, because the water introduced in the deposition process is minimized. Thus, the dopants have a tendency to migrate less within the soot preform 20a. In the prior art, the first segment was formed as a core cane and then silica soot was deposited to form the second soot segment followed by doping of the second segment soot in consolidation furnace.

Glassy Barrier Layer

In accordance with another embodiment of the invention, at least one glassy barrier layer (e.g., 35a) is formed in the soot preform during the deposition step. As best illustrated in FIG. 8, the glassy barrier layer 35a is preferably a thin layer of vitrified glass. The barrier layer 35a functions to substantially minimize the migration of any dopant (as well as water (H, OH)) present between segments of the soot preform, for example between a first and second annular segments 40', 42'. The term "glassy" as used herein encompasses both fully vitrified glass as well as a partially vitrified glass. The layer only needs to be sufficiently vitrified (glassy) to substantially minimize migration of the dopant and/or water.

In one embodiment, the glassy barrier layer 35a is formed by subjecting the thin layer of soot to sufficient heat to fully vitrifying it into a consolidated glass. First, a first soot segment 40' is formed. A first portion of the first soot segment is then vitrified to form the at least one glassy barrier layer 35a. Finally, prior to consolidation of a remaining portion of the first soot segment 40', a second soot segment 42' is deposited onto the at least one glassy barrier layer 35a. The glassy barrier layer 35a is effective at reducing the migration of any dopant, such as fluorine, from one segment to the other segment adjacent to the barrier. It should be understood that not only may the glassy barrier layer be formed on an outer radial periphery of the first soot segment, but it also may be formed on an inner radial periphery of the second soot segment. Barriers are particularly important when fluorine is present in an amount greater than 1.0% by weight in at least a portion of the segment. The glassy barrier layer has the distinct advantage of allowing the manufacture of sharp segment transitions in the consolidated preform. Sharp, non-rounded, transitions resultantly improve both fiber attenuation and bend performance.

Figure 32:
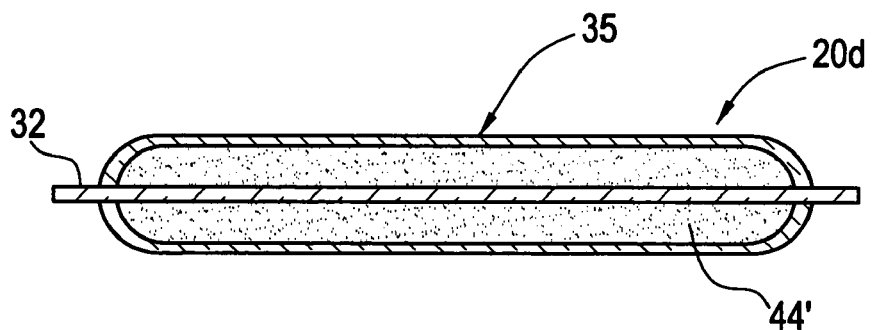
FIG. 32 illustrates a cross-sectional side view of a preform including a barrier layer in accordance with an embodiment of the invention.

Preferably, the glassy barrier layer 35a has a thickness "t" (FIG. 24) of less than about 200 μm, more preferably less than about 100 μm, more preferably yet, less than about 30 μm, and most preferably between about 10 μm and 200 μm. In the embodiment shown in FIG. 8, the glassy barrier layer 35a is formed within the soot preform 20a and includes soot on both the inner and outer radial sides thereof. Preferably, the barrier layer 35a is formed along the entire length of the preform, thus forming a tubular shaped structure. Optionally the barrier 35 may even be formed over the unusable end portions of the preform 20d at the ends as shown in FIG. 32. This functions to seal the soot segment 44' which contains the dry soot manufactured in accordance with one or more of the aforementioned substantially dry processes.

Barrier layers are particularly effective at minimizing the migration of fluorine, which is generally very mobile because of its small molecular size and activity. Thus, if, for example, in FIG. 8, the second soot segment 42' includes a fluorine dopant, then the barrier layer 35a will minimize the migration of fluorine from the second segment 42' into the first soot segment 40'.

Figure 9:
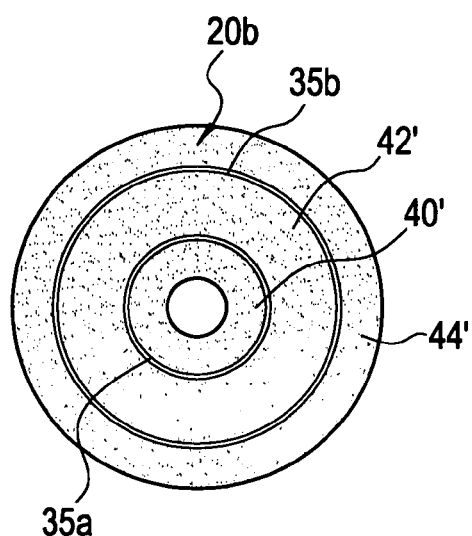
Figure 10:
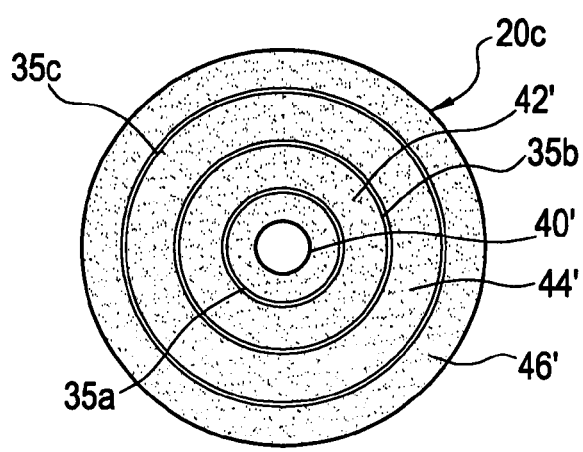

In accordance with another embodiment of the invention, multiple barrier layers may be employed in optical fiber soot preforms. Such multi-barrier layers are useful in the manufacture of multi-segment core preforms, for example. In FIG. 9 and 10, a third soot segment 44' is laid down adjacent to the second soot segment 42' and over a second barrier layer 35b. The second barrier layer 35b prevents any dopants from migrating out of the soot layer 42' and into the soot layer 44' of the preforms 20b, 20c and visa versa. Likewise, as shown in FIG. 10, a fourth layer 46' and a third barrier layer 35c may be formed. In accordance with one embodiment, the fourth layer 46' is also fluorine doped, whereas the third layer is preferably germania doped. Additional glassy barrier layers may be employed as needed. Because the layers (e.g., 42', 44') in-between the barrier layers (35a; 35b, 35c) are substantially dry, the water removal in consolidation of these multi-segment preforms is not seen as an issue.

Figure 5:
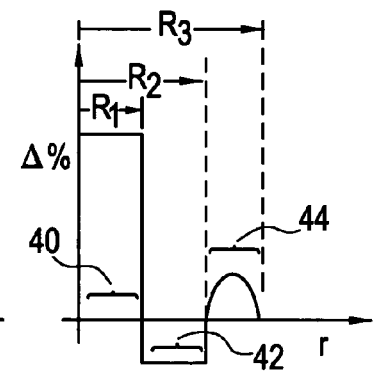
Figure 6:
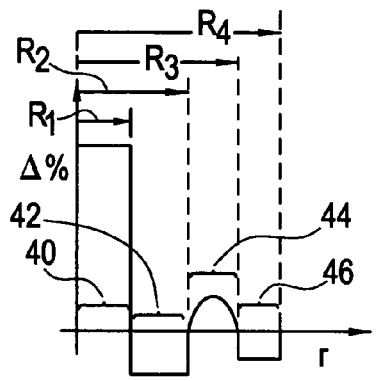

FIGS. 8–10 illustrate soot preforms 20a–c that are formed on a mandrel (thus forming the centerline aperture upon its removal) in one deposition step, i.e., without any intermediate consolidation step of the first formed segments. The FIG. 9 soot preform will produce a core cane having a refractive index profile like that shown in FIG. 5. Likewise, the soot preform of FIG. 10 will produce a core cane having a refractive index profile as shown in FIG. 6. Additional silica soot may be deposited on the formed core canes once formed from the soot preforms of FIGS. 8–10. The deposition process for the additional silica soot may be the substantially dry process described herein or by conventional deposition methods.

Figure 11:
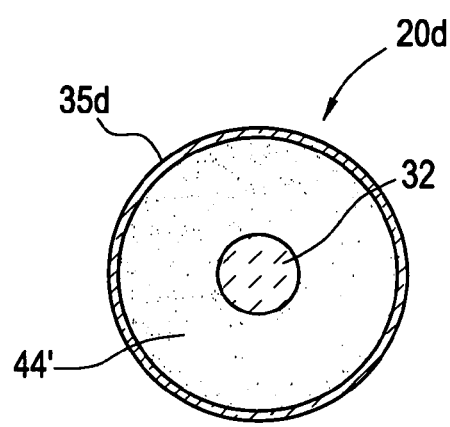
Figure 22:
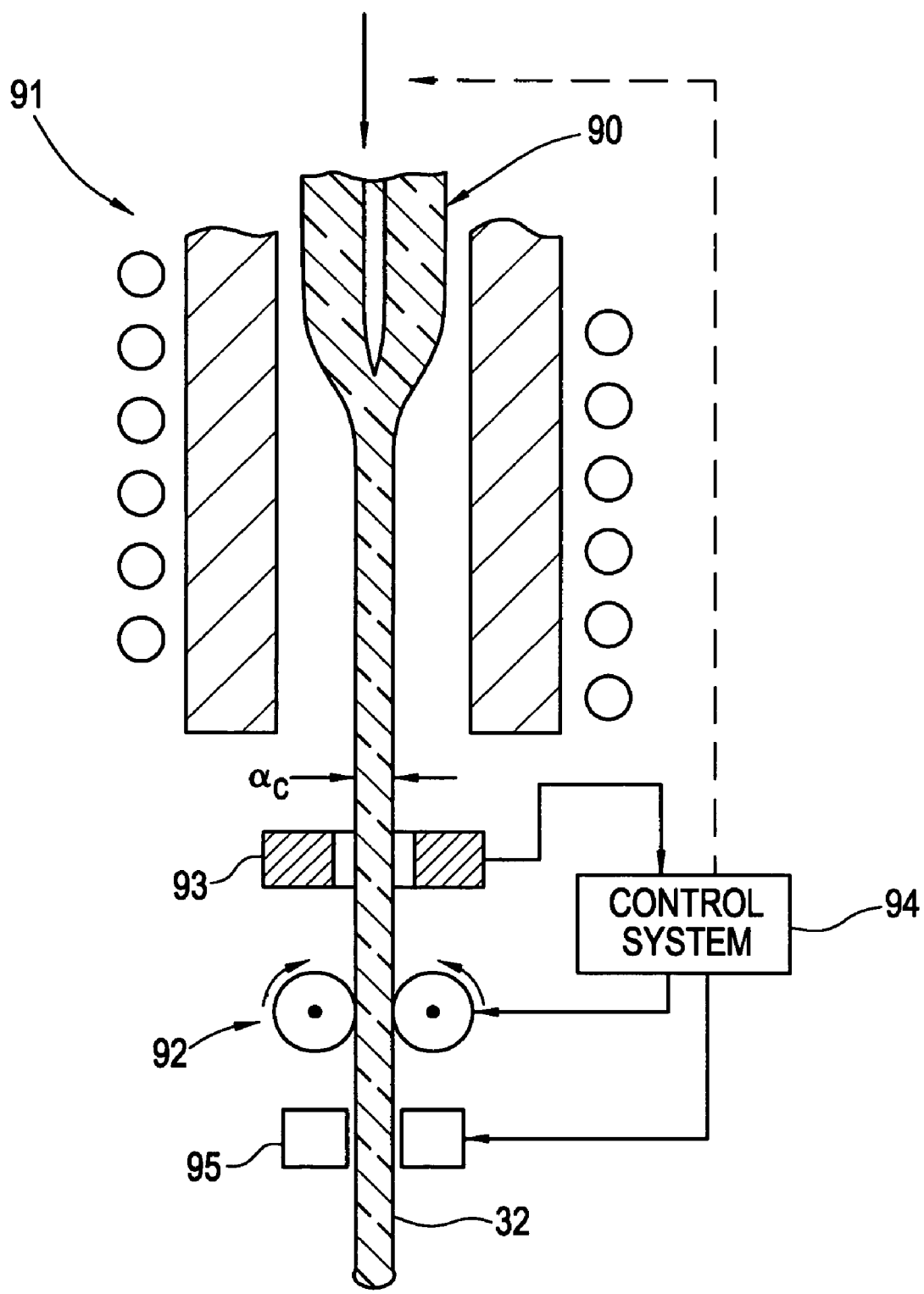
FIG. 22 illustrates a partially cross-sectional side view of a core cane drawing apparatus in accordance with an embodiment of the invention.

FIGS. 11 and 32 illustrate a preform 20d that is manufactured in accordance with a two or more step process. The core cane 32 (which preferably includes some or all of the physical core portion of the final preform) is manufactured in a first step from a core preform in accordance with the process shown in FIG. 22. The core cane 32 is manufactured by inserting the consolidated preform 90 into a furnace 91. The preform 90 is then heated and melted at between about 1800° C. 2200° C. and drawn into a slender rod of diameter $d_c$. A tractor assembly 92 applies tension while the preform 90 is lowered at a preferably constant downfeed rate into the furnace 91. A diameter sensor 93 senses the diameter and sends a signal to a control system 94 that controls the speed of the tractor downfeed rate to maintain the desired set diameter. Optionally, the control system 94 may variably control the downfeed rate. Once an appropriate length of cane 32 is been drawn, a cutter 95, such as a flame cutter or scoring apparatus, is activated to cut the core cane 32 into the desired length. The core cane 32 may include one or more distinct segments within it (generally corresponding to refractive index profile segments in the fiber) manufactured in accordance with the dry deposition process described herein or conventional (wet) processes.

Figure 7:
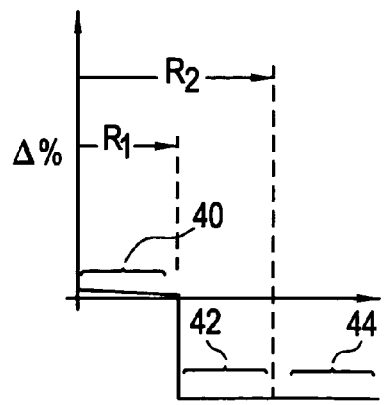

In accordance with one embodiment, as shown in FIG. 7 and 11, the core cane 32 includes a silica core and fluorine doped region corresponding to segments 40 and 42, respectively, and a soot region 44' which is also fluorine doped corresponding to segment 44. A barrier layer 35d may be employed on the preform 20d to help minimize escape of fluorine during consolidation. In FIG. 7, the segment 44' is preferably deposited by the substantially dry deposition method described herein. It should be recognized that silica-containing soot including germania, fluorine and other suitable dopants may be deposited in accordance with the substantially dry deposition method of the present invention in any one of the segments. For example, in FIGS. 4–6, a germania dopant may be added in the first soot segment during deposition resulting in an up doped segment in the refractive index profile. In FIGS. 4–7, fluorine is added to the second soot segment, thus down doping second segment 42. In FIGS. 5 and 6, the third segments are up doped with germainia. FIG. 6 illustrates a fourth segment having a fluorine down dopant. It should be recognized that any one, some or all of the soot segments may be manufactured by a flame hydrolysis process wherein a substantially hydrogen-free fuel is ignited to form a flame and a glass precursor is flowed (preferably in gaseous form) into a flame.

The layer may be vitrified by any method able to apply sufficient heat to the surface thereof. For example, one preferred method of vitrifying involves firepolishing with a flame. Preferably, the flame is produced by igniting a substantially hydrogen-free fuel (e.g., carbon monoxide) so that the vitrifying step does not add any appreciable water to the preform.

Barrier Layer Formed By A Laser

Another method for vitrifying the layer comprises exposing the surface portion to a laser beam 60 emanating from a laser device 62 as described in FIGS. 26–29. A laser device 62, such as a $CO_2$ laser, emits a collimated beam portion 60a having a spot diameter d of about 2 mm to 4 mm. The beam portion 60a is passed through a focusing device 64, such as a lens, thereby providing a focused beam 60b. That focused beam 60b is focused on the surface 41 of the soot preform 20 such that it exhibits a exposure point 65b at the surface 41 of diameter d' of between about 0.5 mm and 2.5 mm. The laser beam 60b has sufficient energy to vitrify the surface 41 and form the vitrified glassy layer 35 as the preform 20 is rotated about its axis.

Figure 26:
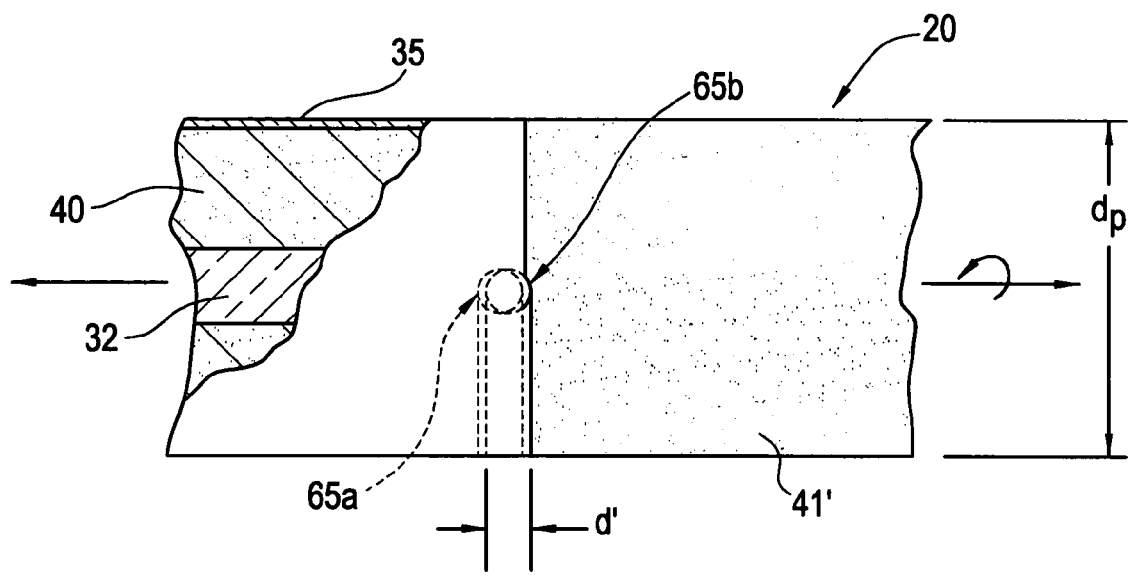
FIG. 26 illustrates a partially cross-sectional side view of a optical fiber preform having a glassy barrier layer formed thereon in accordance with an embodiment of the invention.
Figure 27:
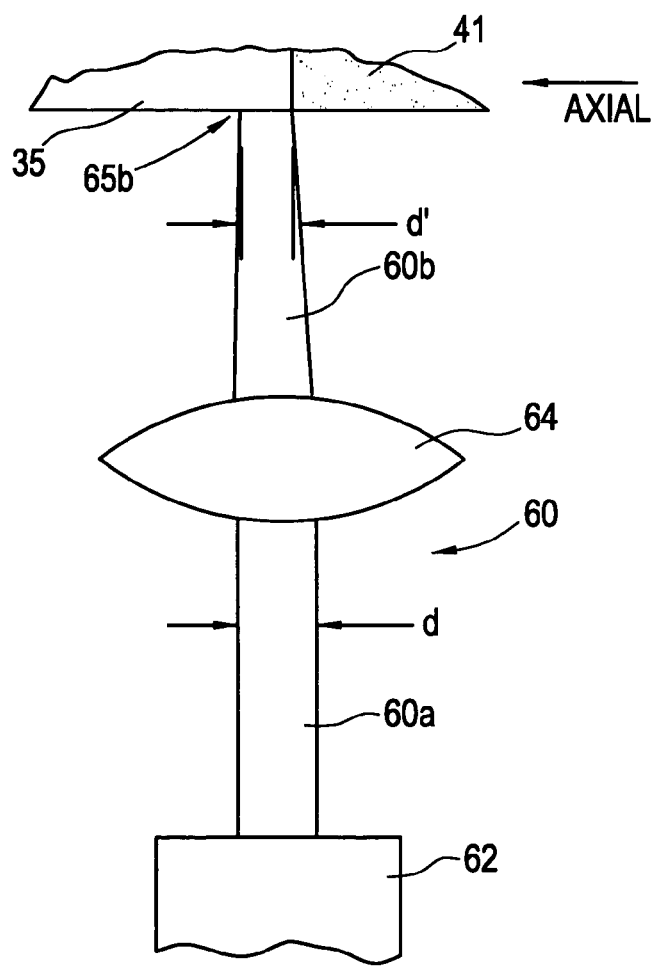
FIGS. 27–29 illustrate various top views of an apparatus and method for forming a glassy barrier layer on an optical fiber preform in accordance with an embodiment of the invention.
Figure 28:
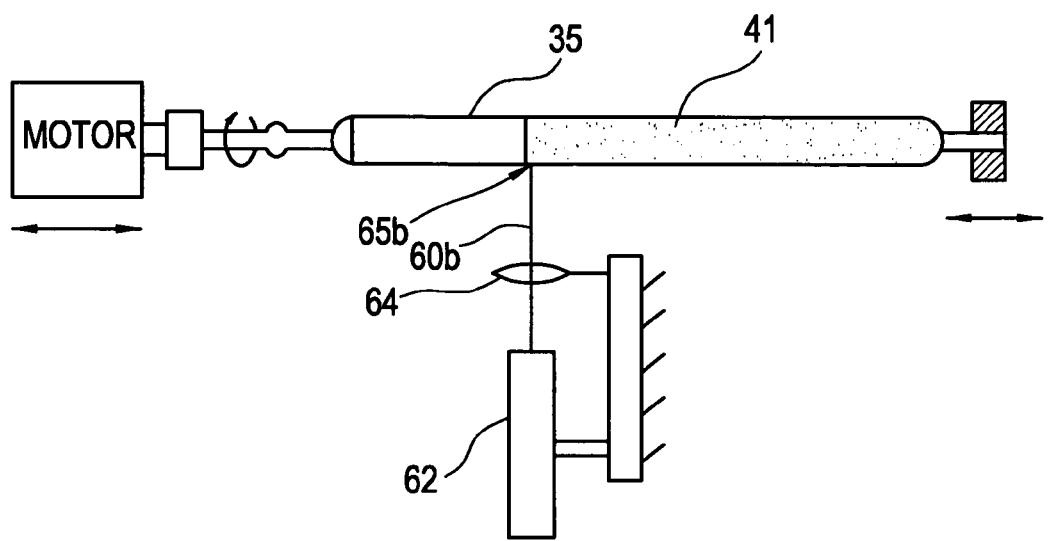
Figure 29:
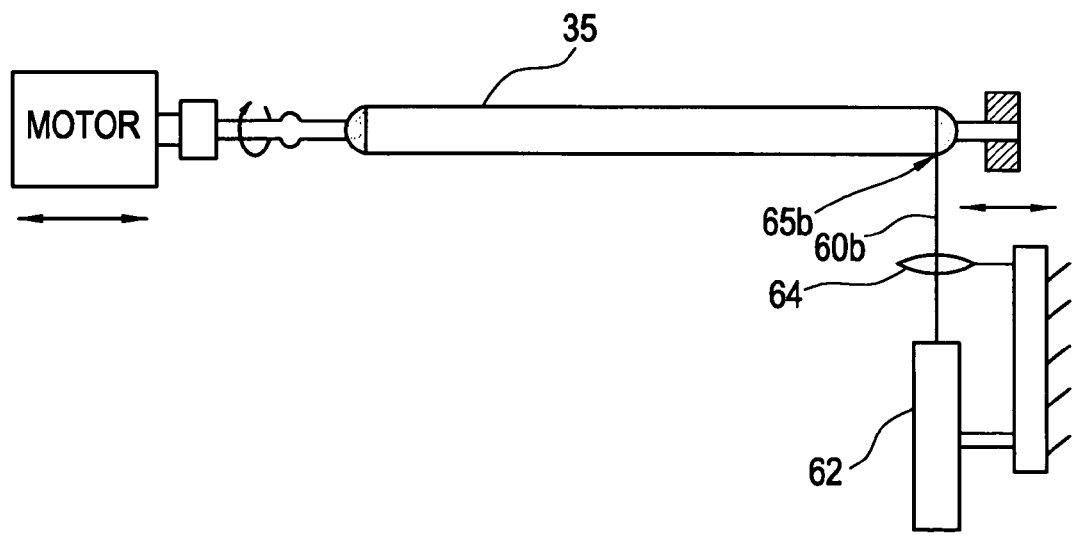

In the illustrated embodiments of FIGS. 26 and 27, for each rotation, the laser or preform is moved in the axial direction by an incremental amount, for example, from exposure point 65a to 65b. In this fashion, the laser beam 60b is traversed along the axial length of the preform 20 as shown in FIG. 28 (shown half way across) and FIG. 29 (shown traversed the full way across the preform). The two successive positions 65a, 65b of a first and a revolution, respectively, overlap such that surface 41 is vitrified to the desired depth without any portion of the surface being missed. However, it should be noted that any axial traversal scheme may be employed such that the entire surface becomes vitrified. Preferably, deposition is suspended while the vitrified layer 35 is being formed. It should be recognized, that although the exemplary embodiments of a laser and firepolishing have been provided, that other means for vitrifying the surface may be utilizes as well, such as induction heating, and plasma torch. Any means that may generate sufficient heat may be employed.

Forming the Glassy Barrier Layer with an Induction Heater

Figure 36:
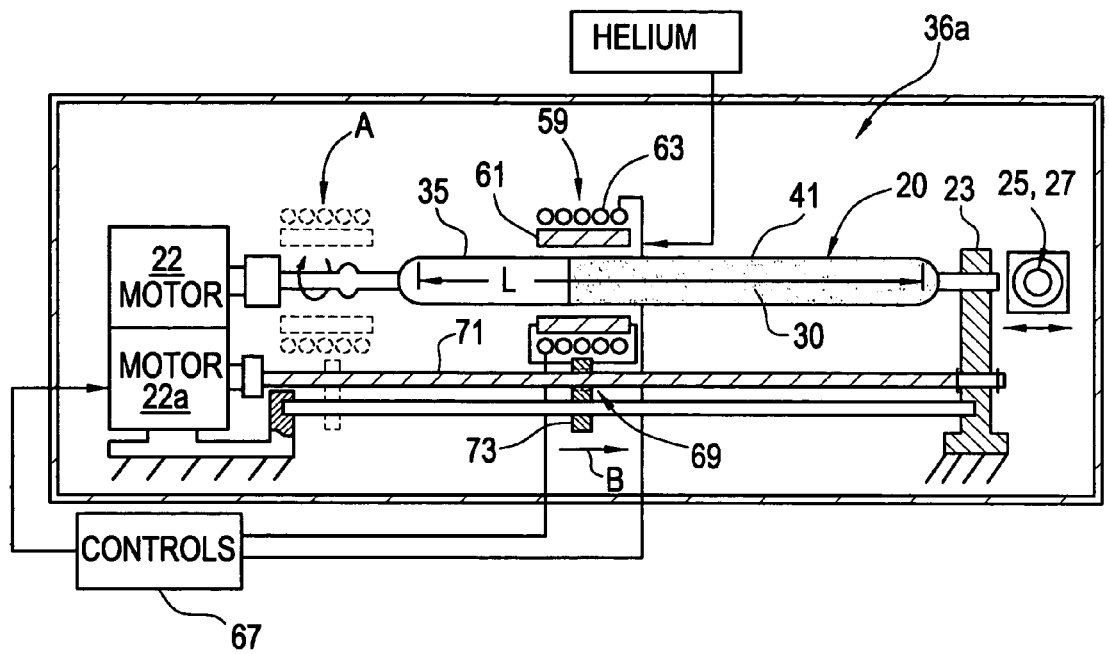
FIG. 36 illustrates a partially cross-sectioned top view of a lathe assembly with an attached induction heater assembly in accordance with an embodiment of the invention.
Figure 38:
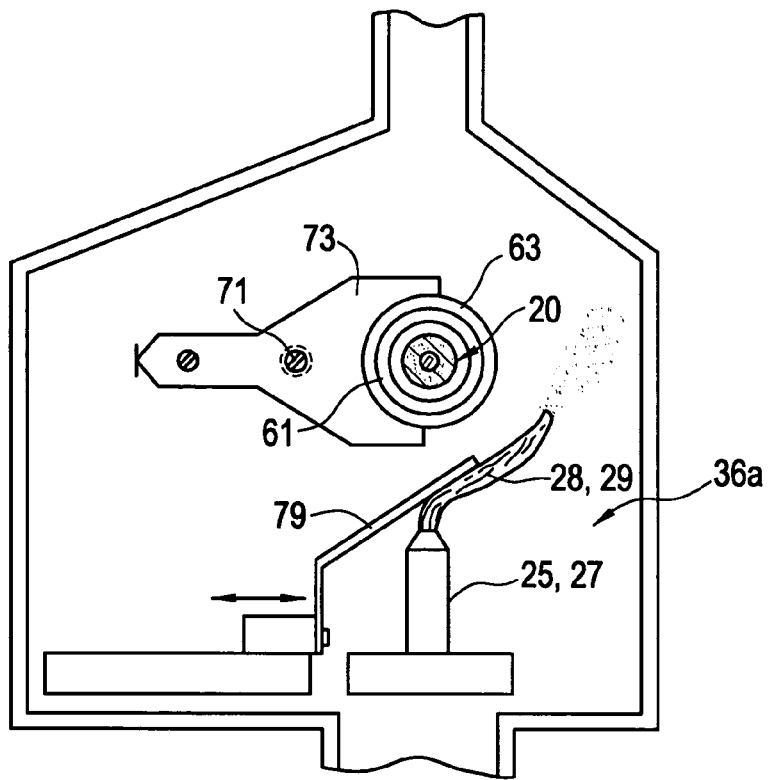
FIGS. 38 and 39 illustrate partially cross-sectional views of a deflector assembly in accordance with an embodiment of the invention.
Figure 39:
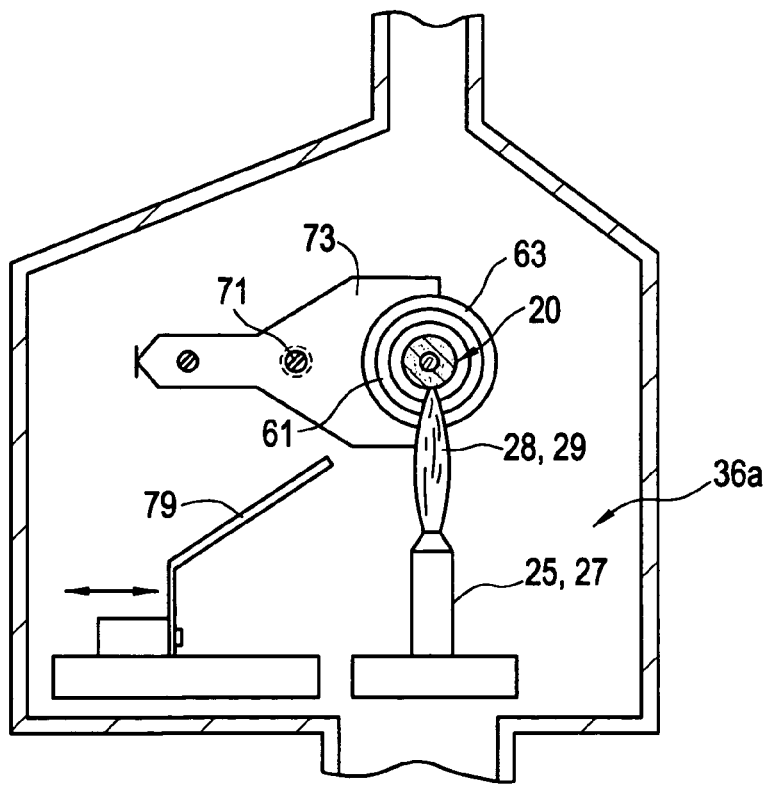

One particularly well suited method of producing a glassy barrier layer 35 in accordance with an embodiment of the invention comprises passing an induction heater 59 along the axial length of the preform 20 as is shown in FIGS. 36 and 38–39 to vitrify a thin layer of the soot and form the glassy barrier layer 35. The induction heater 59 preferably includes a susceptor 61, such as a annular ring of suitable susceptor material (e.g., graphite) and an induction coil 63 wound about the susceptor 61. Four winds of water-cooled copper induction coils performed acceptably. When sufficient power (between 2.0 to 4.0 kilowatts) is supplied to the induction coil, the susceptor heats up to a sufficiently high temperature to cause the surface of the soot preform 20 to fully vitrify, i.e., consolidate. The extent (depth) of the vitrification is controlled by a control system 67 supplying power to the coil 63 and controlling the traverse speed as indicated by arrow B.

In operation, the method of manufacturing an optical fiber preform in accordance with an embodiment of the invention, comprising the steps of forming a first silica soot section 30 of the preform 20 by depositing silica-containing soot onto an outer surface of rotating deposition surface 41, then exposing at least part of the length of the section 30 to heat generated by an induction heater 59 to form a glassy barrier layer 35 on only a surface of the section. Preferably, at least the entire useable length "L" of the preform 20 is exposed to the heat to form the glassy barrier layer. Even the ends are preferably heated to form a sealed end. After the glassy barrier layer 35 is formed, additional deposition of a second silica-containing soot section over top of the glassy barrier layer 35 may be performed as heretofore described herein. Preferably, at least one of the first and second silica-containing soot sections comprises a fluorine dopant As elucidated herein, the glassy barrier layer 35 substantially minimizes migration of the dopant between the sections. Moreover, it prevents re-wetting of the sections that may have been formed by a dry process as described herein.

In more detail, a lathe apparatus with motor 22, chuck, and end support 23 is adapted to support the silica soot section 30 of the preform 20 within a deposition chamber 36a. The induction heater 59 and its drive assembly is mounted proximate the lathe and the heater is adapted to generate heat to form a glassy barrier layer 35 on the outside surface of the preform. During deposition, the entire frame may move and the burner(s) may remain stationary or visa versa. However, it should be recognized that the lathe assembly and the heater and its drive assembly are preferably coupled. The induction heater 59 is preferably stationed at a position out of the way off an end of the preform during soot deposition, as is shown by dotted lines labeled "A." After a predetermined amount of soot has been deposited onto the preform 20, the control system 67 initiates a command for the induction heater 59 to move axially from its stationed position. The movement may be accomplished by any suitable traverse mechanism. For example, a motor 22a mounted stationary with the lathe's drive motor 22 may drive a screw drive assembly 69 or other suitable drive mechanism attached to the induction heater assembly 59. As shown, the motor 22a rotates a lead screw 71 that is threaded into a drive plate 73 extending from and rigidly secured to the heater 59. Rotation of the lead screw 71 by motor 22a moves the drive plate 73 and, thus, the induction heater 59. The drive plate 73 is slidably received on a parallel bar 75 fixedly mounted to the frame to prevent rotation of the heater 59 while axially traversing. Other suitable anti-rotation restraint may be employed. Thus, the drive assembly 69 enables the heater 59 to be traversed axially and the susceptor and the induction coil to encircle the preform when forming the glassy barrier layer. The assembly allows the heater to be positioned in a defined relation to the center of the preform and traverse at the desired rate as commanded by the controls. The controls 67 for the induction heater 59 may preferably interface with the controls of the lathe such that the formation of the glassy layer is suitably synchronized with the deposition steps.

By way of example, the inventors have discovered that traversing the induction heater 59 at an axial speed in a range between about 0.5 cm/s to 3.0 cm/s, and more preferably in the range between 1.0 to 2.0 cm/s, and at a power of between 2.0 to 4.0 kilowatts, and more preferably between 2.5 and 3.0 kilowatts allows the formation of a suitable thickness barrier layer preferably made in one pass. Preferably also, rotating the preform 20 at a rotational rate of between about 80 rpm and 160 rpm during the formation of the glassy layer 35 further enhances its uniformity. During the step of exposing, the annular space between the graphite susceptor 61 of the heater 59 and the preform 20 is purged with helium.

Figure 37:
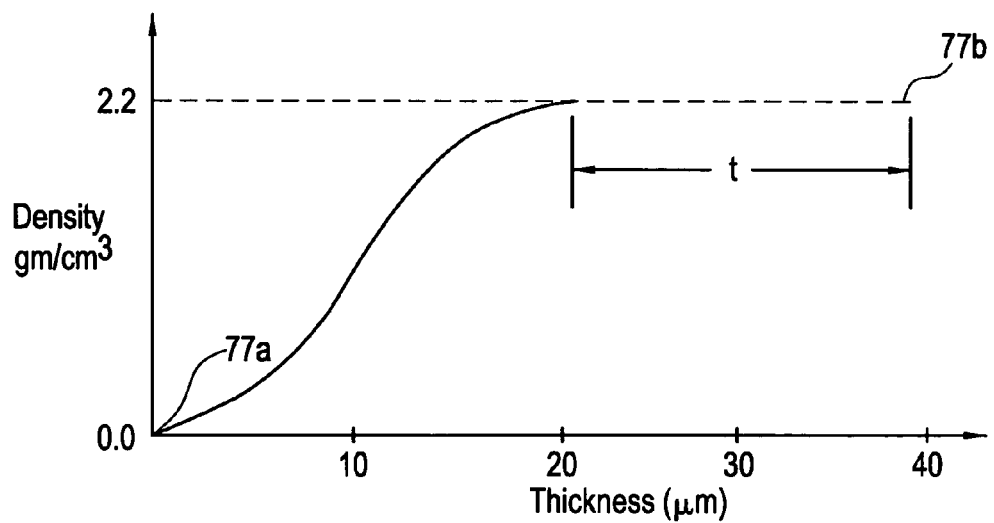
FIG. 37 illustrates a graphical plot of thickness versus density of a glassy barrier layer in accordance with an embodiment of the present invention.

The inventors herein have also determined that the method of employing an induction heater provides a smooth, radial density gradient in the barrier layer 35 that will advantageously resist cracking during the preform consolidation process performed later. For example, as shown in FIG. 37, a plot of density versus thickness of the barrier layer formed. In the plot, it is illustrated that the density of the layer as a function of radial dimension varies from a small value at an innermost part 77a of the barrier to a high value at or near the outermost part 77b. The density profile illustrated is preferably constant for the useable length L of the preform. As is depicted in the diagram of FIG. 37, it is preferable that the thickness t of the barrier layer be preferably greater than about 10 μm. This thickness value is measured as the thickness that is preferably fully consolidated. For example, for undoped fused silica, the fully consolidated density is about 2.2 gm/cm$^3$ as shown.

Prior to the step of exposing, a conventional or dry burner 25, 27 (See FIGS. 1 and 18), as described herein, is used for forming the first silica-containing section 30. During the step of exposing, the burner 25, 27 is preferably moved aside as shown in FIG. 36, such that a soot stream emitted from the burner 25, 27 does not contact the preform 20. If multiple burners are employed, they may be moved aside in any suitable fashion. In accordance with another embodiment shown in FIGS. 38 and 39, during the step of exposing wherein the glassy barrier layer 35 is formed, the flame 28, 29 of a soot-producing burner 25, 27 used for forming the first silica-containing section 30 is preferably deflected aside by a deflector 79. The deflector is preferably moveable and moves out of the way after the barrier layer has been completed, thus enabling formation of a second silica-containing soot layer. As should be understood, the step of exposing preferably takes place within the deposition chamber 36a.

Figure 24:
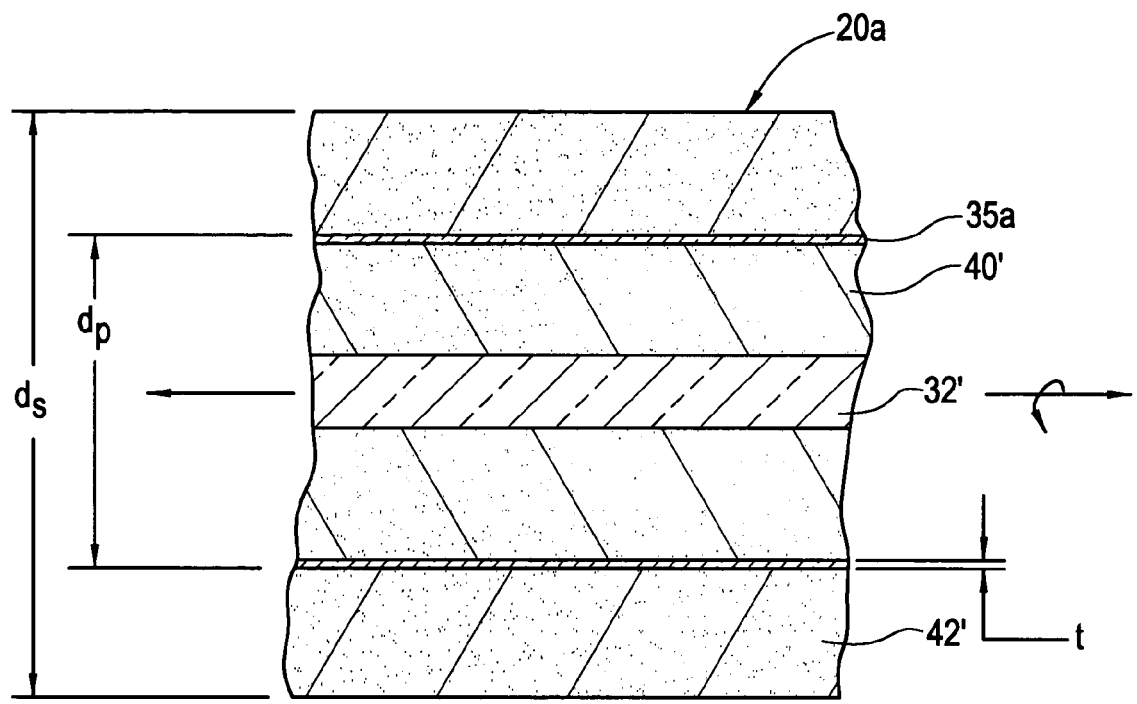
FIGS. 24 and 25 illustrate cross-sectional side views of optical fiber preform in accordance with an embodiment of the invention.
Figure 25:
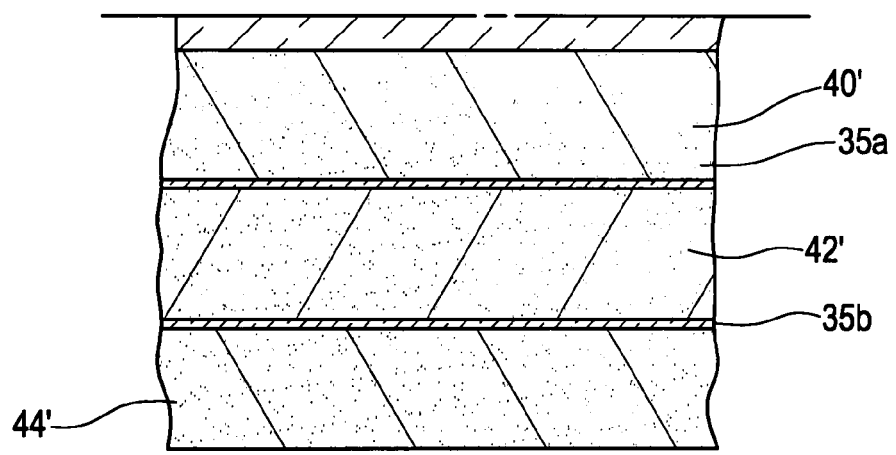

As shown in FIG. 24 and 26, one preferred method of manufacturing an optical fiber preform 20a, having a glassy barrier layer 35a comprises the steps of depositing a first silica-containing soot region 40' on an outside surface of a rotating substrate 32' (such as the core cane shown) to a first predefined diameter dp, forming a glassy barrier layer 35a adjacent to an outermost radial extent of the first soot region 40' by vitrifying a surface layer of the first silica-containing soot region; and depositing a second silica-containing soot region 42' on an outside radial surface of the glassy barrier layer 35a to a second predefined diameter ds. The second soot region 42' preferably includes a fluorine dopant. As shown in FIG. 25, a third soot segment 44' may be deposited on an outer radial extent of the second barrier layer 35b. This region preferably includes a germania dopant. Although barrier layers of specific structure are illustrated herein, the shape and dimensions of the barrier layer may be modified without departing from the claims herein.

Combined Conventional and Substantially Water-Free Deposition Method

Figure 18:
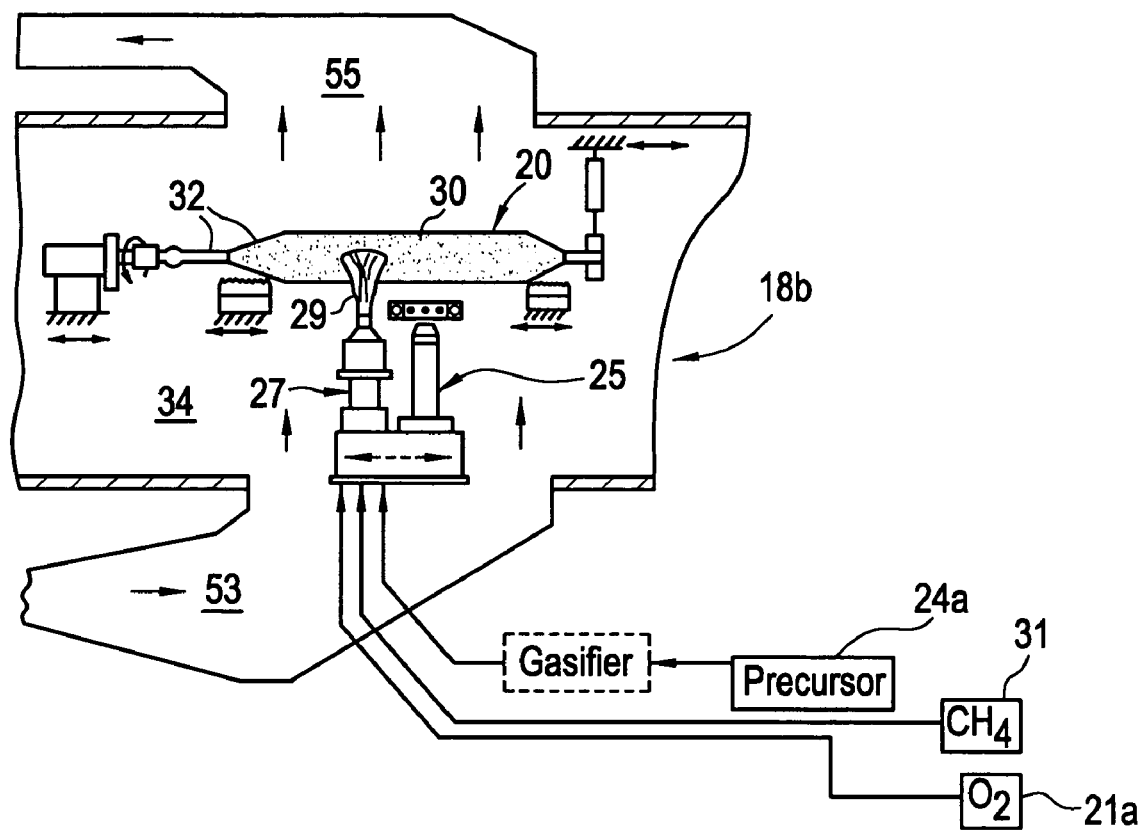
FIG. 18 illustrates a schematic view of the soot preform wherein soot is being deposited by a conventional method wherein the conventional burner is mounted alongside a carbon monoxide burner.

According to another illustrated embodiment of the invention, as best shown in FIG. 1 and FIG. 18, a soot preform 20 is formed within a lathe apparatus 18a, 18b by forming one or more segments of the silica-containing soot by a conventional process and another part by a substantially dry process as described herein-below. In particular, the conventionally formed segments are produced by introducing a silica-containing precursor 24a into a flame 29 of the burner 27 produced by igniting a hydrogen-containing fuel 31, such as methane. The substantially dry segments comprising one or more other segments of silica-containing soot are formed by introducing a silica-containing precursor 24 into another separate flame 28 formed by igniting a substantially hydrogen-free fuel 26 (FIG. 1). The conventional and dry deposition steps may occur in any order.

For example, a first part of the soot preform 20 may be formed by oxidizing a precursor in the substantially dry flame 28 (FIG. 1). The flame 28 is formed by combusting carbon monoxide 26 in a burner 25, and utilizing oxygen 21 as the combustion-supporting gas. A second part of the preform 20 may be formed by a conventional method by oxidizing a precursor 24a in a burner 27 having a conventional flame 29 to produce soot 30 deposited on a substrate 32, as shown in FIG. 18b. For example, the flame may combust methane 31 and utilize oxygen 21a as the combustion supporting gas. The substantially dry process may be utilized to form portions of the preform's core, for example, whereas the conventional process may be utilized to deposit the preform's cladding at a high deposition rate. Optionally, the steps may be reversed. It should be recognized that the conventional and substantially dry deposition process may be utilized in combination in any order or sequence. A glassy barrier layer, as described herein, is preferably utilized to prevent migration of water or dopants to the portion made by the dry process. The glassy barrier layer may be located at an interface between a first and second segment, for example and may be formed in either one of the first and second soot segments. Most preferably, the glassy barrier layer 35 is formed utilizing the substantially-hydrogen free fuel 26, thus minimizing trapped water within the barrier layer. Additional barrier layers may be utilized as desired. For example, a second glassy barrier layer 35b formed at an interface of the second segment 42' and a third segment 44'. Moreover, the whole process is preferably carried out in a substantially dry atmosphere 34 supplied from an inlet 53 and exhausted by an exhaust 55.

Burner

According to another embodiment of the invention, in order to obtain sufficient heat from the dry flame, substantially hydrogen-free fuel 26 and glass precursor 24 are preferably supplied at a predetermined flow ratio recognized by the inventors herein to be important. In particular, to generate sufficient heat, the flow of fuel to the flow of glass precursor 24 should be greater than 20:1. This is accomplished, as recognized by the inventors herein, by proper sizing of the various passages within the combustion burner 25. One preferable combustion burner is illustrated in FIG. 21. The burner adapted for combusting substantially hydrogen-free gas shall be referred to herein as a "dry combustion burner." The dry combustion burner 25 includes a center fume tube 68, formed as a slender tube, and is adapted to supply the gaseous precursor. Preferably surrounding the fume tube 68 is an inner shield passage 74 that is adapted to carry oxygen. Oxygen, a combustion supporting gas, is supplied in a ration of fuel to combustion supporting gas of about 2:1. Surrounding the fume tube 68 and inner shield 74 is the fuel passage 70 adapted to carry the large volumes of substantially hydrogen-free fuel. Although not shown exactly to scale, it is apparent that the cross-sectional area of the fuel passage 70 is much larger than of the fume tube 68. Because, for example, carbon monoxide contains less heat when ignited, higher flows are required as compared to methane. This is designed such that the glass precursor 24 may be supplied at a first flow rate to a center fume passage 68 of the combustion burner 25 and that the substantially hydrogen-free fuel 26 may be supplied at a flow rate at least 20 times the first flow rate thereby enabling generation of sufficient heat to oxidize the precursor. The burner 25 may include multiple input ports for supplying the substantially hydrogen-free fuel 26 and the combustion supporting oxygen 21 thereby providing more uniform flow distribution in the annular shaped passages.

Fluorine may be incorporated into the soot in another embodiment of the invention. There are several ways that this may be accomplished in accordance with the invention. First, the fluorine may be included in the precursor, such as when a chlorofluorosilane is used for the precursor 24. In this scenario, the precursor 24 is supplied as a gas to the fume tube 68 and oxidized by the flame 28 (FIG. 1) thereby producing fluorine doped soot in the preform 20. Alternatively, some fuel or oxygen may be supplied with the substantially hydrogen-free fuel.

A second way of introducing fluorine is by flowing fluorine or a fluorine-containing compound such as of $F_2$, $CF_4$, $C_2F_6$, $SF_6$, $NF_3$, $SiF_4$ or combinations thereof in gaseous form into a shield included within the combustion burner. FIG. 31 illustrates a burner 25a that may be utilized to incorporate fluorine-doped soot into the preform 20. Fluorine or the fluorine-containing compound is supplied in gaseous form to outer shield passage 72 surrounding the fuel passage 70. A water cooling jacket may be utilized surrounding the fuel passage. The rest of the design is as heretofore described.

A preferred embodiment of the combustion burner has a center tube 68 adapted to provide a substantially hydrogen-free glass precursor into a flame region, the center tube located along a central axis of the burner 25, 25a (FIG. 21, 31); an inner shield unit 74 adapted to provide oxygen into the flame region 28 (FIG. 1), the inner shield unit radially displaced from the central axis of the burner, a fuel unit 70 radially displaced from the central axis of the burner and adapted to provide a substantially-hydrogen free fuel; and an outer shield unit 72 adapted to provide a fluorine containing gas enshrouding the flame region, the outer shield region radially displaced from the central axis of the burner and positioned outside the inner shield unit and the fuel unit, the burner being adapted for producing substantially water-free, fluorine doped silica.

A third method of incorporating fluorine into the soot is by providing the fluorine or fluorine-containing gas into an expelling element 33 surrounding or partially surrounding the flame 28. One expelling element, i.e., an expelling ring, is described with reference to FIGS. 12 and 13. By the use of these methods, fluorine may be very efficiently incorporated in the soot, thereby utilizing significantly less fluorine that by the prior art method. In the prior art, fluorine was incorporated during a sintering step in the consolidation furnace. In fact, according to an embodiment of the invention, the step of achieving fluorine doping within a segment of the silica-containing soot is accomplished wherein greater than 1% by weight of fluorine is incorporated. This is accomplished by supplying to the flame, fluorine or a fluorine-containing compound in an amount less than 0.5 l/m.

Combination of Substantially H-Free Fuel and Combustion-Enhancing Additives

Figure 35:
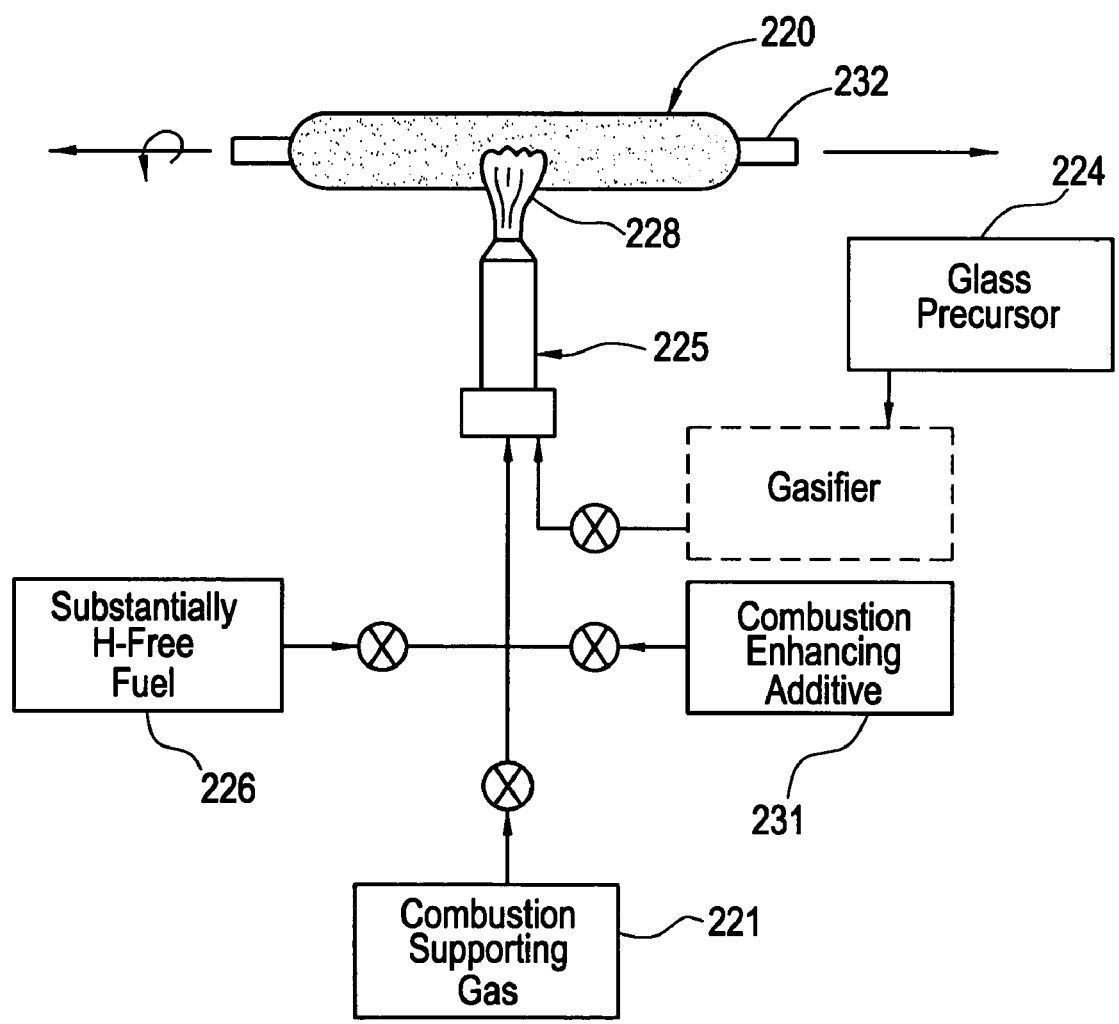
FIG. 35 illustrates a schematic view of burner and supply system utilizing a combination of combustion-enhancing additive and substantially hydrogen-free fuels.

According to another embodiment of the invention, as best illustrated in FIG. 35, a method of producing silica-containing soot having very low water (H, OH) content is described. The method comprises, in one embodiment, utilizing a combination of a substantially hydrogen-free fuel 226 and a fuel additive 231. Supplied to the burner 225 are a combination of a catalyst, for example, a hydrogen-containing fuel, an energetic fuel or an energetic oxidizer, all of which are referred to as fuel additives 231 and a substantially hydrogen-free fuel 226. One reason it is desirable to combine the substantially H-free fuel 226 with a combustion-enhancing additive 231 is to substantially speed up the burning velocity of the substantially hydrogen-free fuel or to increase its heat of combustion. For example, the burning velocity of dry carbon monoxide is less than about 0.1 m/s. The flow rate desired for the precursor fume is on the order of 20–40 m/s. Thus, unless the burning velocity of the fuel can be substantially increased, it is difficult to keep the flame attached to the face of the burner 225 and thus, it tends to blow itself out. Further, it was discovered by the inventors herein that poor flame structure resulting from the slow burning fuels results in poor soot density, capture efficiency, and soot conversion. These resulted from problems such as insufficient heat to the bait rod, and insufficient heat to the fume.

As discovered by the inventors herein, adding small amounts of combustion-enhancing additives 231, such as catalysts in combination with the substantially hydrogen-free fuel significantly increases the burning velocity of the slow burning CO from loess than about 0.1 cm/s to 1 m/s or greater when used in combination. Further, flame temperature, velocity, and structure also improved. This addition in small amounts does not, however, result in detrimental amounts of water in the glass produced. The substantially hydrogen-free fuel 226 is preferably selected from a group consisting of carbon monoxide (CO), carbon suboxide ($C_3O_2$), and carbonyl sulfide (COS). A "catalyst" as used herein is any compound or additive that forms light radicals such as H, OH and O, which increase burning velocity of the fuel combination. This improves burning velocity and flame structure. The catalysts are preferably selected from a group consisting of hydrogen ($H_2$), water ($H_2O$), peroxide ($H_2O_2$), methane ($CH_4$), ethane ($C_2H_6$), propane ($C_3H_8$), ethylene ($C_2H_4$), acetylene ($C_2H_2$), and their deuterated analogs $D_2$ (a naturally occurring isotope of hydrogen), $D_2O$, $D_2O_2$, $CD_4$, $C_2D_6$, $C_3D_8$, $C_2D_2$ and $C_2D_4$. The catalysts may also include sources of oxygen radicals (e.g., ozone ($O_3$)), HCN, and nitrous oxide (NO).

In another embodiment, the additive may also comprise what is termed herein an "energetic fuel" or "energetic oxidizer". These additives exhibit exothermic properties, such that the heat contributed from their combustion is greater that the heat required to raise the temperature of the energetic fuel or energetic oxidizer to the flame temperature. In other words, they increase the flame temperature. Energetic fuels or oxidizers include low molecular weight hydrocarbons, their deuterated analogs and certain other compounds (e.g., HCN, $C_2Cl_2$, and $(CN)_2$). However, any suitable additive may be utilized that increases the flame heat in accordance with the above mentioned criteria. Although a thermodynamic analysis is needed to positively identify energetic fuels or energetic oxidizers, the presence of double or triple intra-molecular bonds, which contribute significant energy when broken, can be utilized to identify potential candidates.

Preferably, the additive (catalyst, energetic fuel or oxidizer) is supplied in an amount of less than about 50%, more preferably less that 20%, more preferably yet less than 5%, and most preferably less than 1%. As little as 1% or less was discovered to improve the burning velocity significantly. This allows the flame 228 to adequately seat onto the burner 225. Larger amounts of additives 231 may be needed for deposition of germania in the desired amounts. The amount of additive 231 needed is also discovered to be dependent on the humidity of the atmosphere. Thus, it should be understood, that more combustion-enhancing additive 231 is needed when a substantially water H-free atmosphere is provided shrouding the flame (See FIG. 1, 18–20). As shown in FIG. 35, the combination of substantially H-free fuel 226 and combustion enhancing additive 231 is ignited to form a flame 228 and a glass precursor 224 is flowed into the flame. The silica-containing soot that is formed is preferably deposited onto a rotating substrate 232 to form an optical fiber soot preform 220.

The exact amount of additive desired is of course based upon how its addition affects the attenuation in the telecom window (1530–1580 nm) due to the absorption peak (water peak) at 1380. However, in one example, 0.1% $CH_4$ in a $CO/O_2$ flame resulted in less than 300 ppb of water in the glass. It is believed that the use of deuterated analogs will further lower the attenuation at the telecom window, because their absorption peak will occur at about 1870 nm, far away from the telecom window.

Photomask

Figure 30:
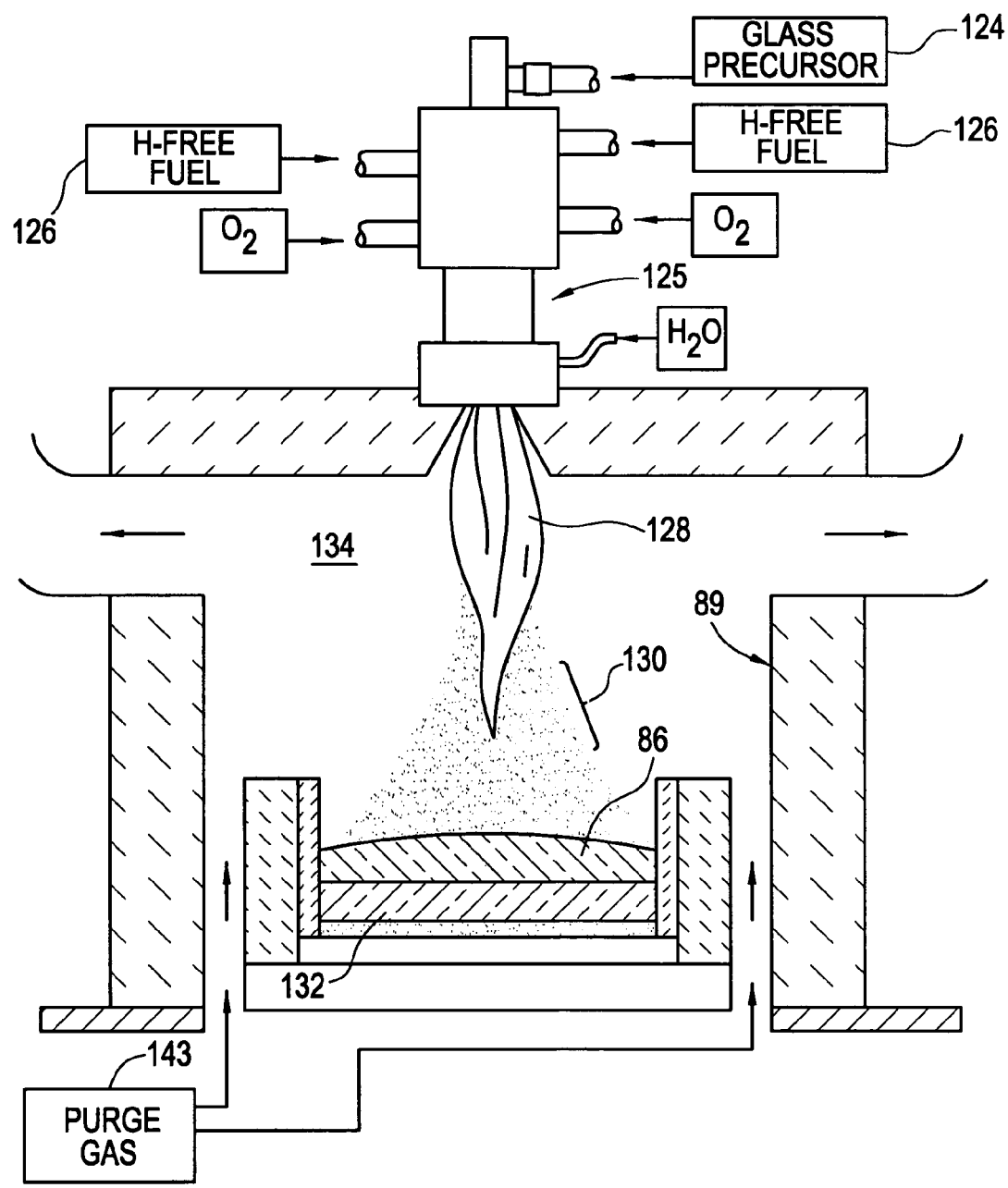
FIG. 30 illustrates a partially cross-sectional side view of a method and apparatus for forming substantially water free high purity fused silica in accordance with an embodiment of the invention.

In accordance with another illustrated embodiment of FIG. 30, the substantially hydrogen free fuel may be utilized for making a glass article, such as a disc of High Purity Fused Silica (HPFS) glass 86. This HPFS 86 may be used for photomasks utilized in making semiconductor chips. In the case of making HPFS, silicon-containing gas molecules are reacted in a flame 128 to form $SiO_2$ particles. These particles are deposited on the hot surface of a body 132 where they consolidate into a very viscous fluid (deposited and virtually simultaneously vitrified) which is later cooled to the glassy (solid) state, i.e., the HPFS glass 86.

According to another embodiment of the invention, a method for producing a vitrified glass article is provided. The method preferably comprises the steps of generating heat from a combustion burner 125 having a flame 128 that is produced by igniting a substantially hydrogen-free fuel 126, the flame 128 being the only source of heat, flowing a glass precursor 124 into the flame 128 to produce silica containing soot 130, and depositing the silica containing soot onto a substrate 132 and substantially simultaneously converting the soot to form the vitrified glass article 86. In accordance with a preferred embodiment, the soot is deposited onto a substrate 132 that is itself a silica-containing glass member, and most preferably a HPFS glass disc. Preferably, the substrate 132 is mounted onto a bed of sand 88. By utilizing the substantially hydrogen free fuel in accordance with the invention, the vitrified glass article 86 contains water (OH) in amount less than about several ppm. In the illustrated embodiment, the step of depositing takes place within a chamber 89. Preferably, a purge gas, such as nitrogen, is provided into the chamber such that a substantially water free environment is provided. Generally, it is desirable to provide a pressurized atmosphere in the chamber 89 greater than an atmospheric pressure outside of the chamber.

In summary, the present processes in accordance with the invention can make preforms or glass boules or other glass or soot articles having extremely low water content (less than about several ppm). The method can be used where the deposition and consolidation occur separately, or in one simultaneous forming step. The substantially water-free glass is suitable for making photomask products or preforms for optical fiber manufacture as the resultant glass contains very low amounts of water.

The substantially water-free fused silica generally has a water content of less than 0.1% by weight. Preferably, the water content is less than 0.5% by weight. In theory, the fused silica is completely water-free. Practically, however, water contents below 0.1% by weight may be achieved.

To demonstrate this invention, the following experimental runs were done in a single burner fused silica laydown furnace. A standard run which produced a 6" dia.×1½ thick boule were done.

EXAMPLE I

Prior Art

In the OWG process, silica particles generated in flame are deposited on a colder target as amorphous or semi-sintered silica particles. The raw material for silica is OMCTS and the fuel used in natural gas. The blank thus formed is high in water-content. The blank is consolidated in the presence of fluorine to dry the fused silica glass formed. The blank after consolidation typically has a diameter of 4" and has index of refraction striation that appears as annular rings. To make larger product, a piece of the blank has to be heated to softening temperature and allowed to flow out. This introduces another step to manufacturing and an opportunity to introduce contaminants in the glass.

The sensible heat released in the methane reaction of Prior Art Equation III is 802.4 kJ that under adiabatic conditions (no energy loss) will be used to heat up 3 moles of products formed. Prior Art Equation IV, the sensible heat released per mole of the product is 267.5 kJ.

EXAMPLE II

The sensible heat released by the combustion of carbon monoxide to carbon dioxide, Equation I, is 283 kJ that under adiabatic conditions is used to heat one mole of product of combustion. The heat released from the combustion of one mole is $CH_4$ is approximately three times that released from one mole of CO. The compensate for the lower heating value of CO, the flow rates of CO have to be at least three times higher to have similar heat release in the furnace. Because the heat released per unit mole of product of combustion during combustion of both methane and carbon monoxide are similar, the adiabatic flame temperatures for CO and $CH_4$ are expected to be similar. The adiabatic flame temperature of CO in air is 1950° C. and that for methane is 1941° C. Adiabatic flame temperatures in oxygen are much higher as the thermal load due to the excess nitrogen in air is eliminated. The adiabatic flame temperature for $CH_4$ in oxygen is 2643° C. The adiabatic flame temperature for CO in oxygen has been calculated to be 2705° C. Based on the similarity of the adiabatic flame temperatures, our process achieves furnace temperatures of close to 1650° C. (similar to the prior art HPFS process) for deposition and consolidation of fused silica using carbon monoxide as the fuel. The accomplish this, burners have to accommodate higher flows of CO at acceptable velocities.

EXAMPLE III

The run conditions for the glass were as follows. This glass was made using a single liquid feed burner. The $SiCl_4$ flow was between 5.5 and 7.5 g/min. Oxygen was used as an atomizing gas at 25 slpm. The CO gas stream was at 50 slpm. The distance at the start of the run from furnace crown to the sand was 9 inches and the crown temperature was maintained at about 1670° C.

As a result, this enables the manufacture of water-free fused silica glass by eliminating the use of any hydrogen containing reactants, both as raw material for silica and as fuel, the products of combustion have been made substantially water-free. Further, wet natural gas may be a source for sodium in addition to the water it carries. By eliminating the use of natural gas from the process, another possible source of contamination has been removed. The major hindrance to achieving high transmission at low wavelengths is iron contaminant. Fortunately, carbon monoxide combines readily with metals and in particular iron. Thus, using the combining power of carbon monoxide with iron adds additional purification to the chemical vapor deposition process of making high purity fused silica.

Still further, to extend the transmission into the extreme ultraviolet range, fluorine may be added to the silica precursor feed tube in the form of carbon tetra-fluoride. The carbon tetra-fluoride will add fluorine to satisfy broken bonds in the structure, improve transmission, and act as a scavenger for any water that may enter the process from ambient recirculated furnace air. To further improve the purity of the CO fuel gas from metal impurities, we pass the CO through a furnace at >500° C. to thermally reduce any contained metals out of the CO fuel stream.

In addition to these embodiments, persons skilled in the art can see that numerous modifications and changes may be made to the above invention without departing from the intended scope thereof.

What is claimed is:

1. A method of manufacturing an optical fiber preform, comprising the steps of:
   forming a first soot segment,
   vitrifying a first portion of the first soot segment to form at least one glassy barrier layer whereby a remainder portion of the first soot segment is not vitrified, and
   prior to consolidation of the remaining portion of the first soot segment, depositing a second soot segment on the at least one glassy barrier layer of said first portion.

2. The method of claim 1 wherein at least one of the first and second soot segments includes a refractive index altering dopant.

3. The method of claim 1 wherein the first glassy barrier layer has a thickness of less than about 200 μm.

4. The method of claim 1 wherein the first glassy barrier layer has a thickness of less than about 100 μm.

5. The method of claim 1 wherein the first glassy barrier layer has a thickness of less than about 30 μm.

6. The method of claim 1 wherein the first glassy barrier layer has a thickness between about 200 μm and about 10 μm.

7. The method of claim 1 further comprising a step of adding a fluorine dopant in the second segment.

8. The method of claim 1 wherein the fluorine is present in an amount greater than 1.0% by weight for at least a portion of the second segment.

9. The method of claim 1 further comprising a step of adding a germania dopant in the first segment during deposition.

10. The method of claim 1 further comprising the steps of:
    doping the first soot segment with germania, and
    doping the second segment with fluorine.

11. The method of claim 1 further comprising the steps of:
    leaving the first soot segment undoped, and
    doping the second segment with fluorine.

12. The method of claim 1 further comprising an additional step of forming a second glassy barrier layer within the preform.

13. The method of claim 1 wherein the step of vitrifying comprises firepolishing with a flame.

14. The method of claim 13 wherein the flame is loaded with soot and is produced by igniting a substantially hydrogen-free fuel.

15. The method of claim 1 wherein the step of vitrifying comprises exposing the portion to a laser beam emanating from a laser device.

16. The method of claim 15 wherein the laser device comprises a CO2 laser.

17. The method of claim 1 further comprising the steps of:
    igniting a substantially hydrogen-free fuel to form a flame, and
    flowing a precursor into a flame to form the first portion, second portion or both.

18. A method of manufacturing an optical fiber perform according to claim 1 wherein
said step of forming the first soot segment includes depositing a first silica-containing soot region on an outside surface of a rotating substrate to a first predefined diameter;
said step of vitrifying the first portion of the first soot segment includes forming a glassy barrier layer adjacent to an outermost radial extent of the first soot portion by vitrifying a surface layer of the first silica-containing soot portion; and
said step of depositing a second silica-containing soot region includes depositing a fluorine dopant on an outside radial surface of the glassy barrier layer to a second predefined diameter.

* * * * *

UNITED STATES PATENT AND TRADEMARK OFFICE
CERTIFICATE OF CORRECTION

PATENT NO.         : 7,089,766 B2                                        Page 1 of 1
APPLICATION NO.    : 11/034359
DATED              : August 15, 2006
INVENTOR(S)        : Gerald E. Burke et al.

It is certified that error appears in the above-identified patent and that said Letters Patent is hereby corrected as shown below:

Title Page, Item (73) Assignee should read: Corning Incorporated, Corning, NY (US)

Signed and Sealed this

Twenty-second Day of December, 2009

David J. Kappos
*Director of the United States Patent and Trademark Office*